(12) United States Patent
Wakui et al.

(10) Patent No.: US 10,611,960 B2
(45) Date of Patent: Apr. 7, 2020

(54) NITRIDE FLUORESCENT MATERIAL AND LIGHT EMITTING DEVICE

(71) Applicant: NICHIA CORPORATION, Anan-shi, Tokushima (JP)

(72) Inventors: Sadakazu Wakui, Tokushima (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/683,262

(22) Filed: Aug. 22, 2017

(65) Prior Publication Data

US 2018/0057739 A1    Mar. 1, 2018

(30) Foreign Application Priority Data

Aug. 24, 2016   (JP) .................................. 2016-163428

(51) Int. Cl.
*H01L 33/50*         (2010.01)
*C09K 11/77*         (2006.01)
(Continued)

(52) U.S. Cl.
CPC ........ *C09K 11/7734* (2013.01); *C09K 11/025* (2013.01); *C09K 11/0883* (2013.01);
(Continued)

(58) Field of Classification Search
CPC .............. C09K 11/7734; C09K 11/025; C09K 11/0883; H01L 33/504; H01L 33/507; H01L 33/502
See application file for complete search history.

(56) References Cited

U.S. PATENT DOCUMENTS 8,153,025 B2 *   4/2012   Schmidt ............. C09K 11/7706
                                                    252/301.4 R
9,062,768 B2     6/2015   Azevedo et al.
(Continued)

FOREIGN PATENT DOCUMENTS

EP         3168280 A2      5/2017
JP       H10259374 A       9/1998
(Continued)

OTHER PUBLICATIONS

Phillip Pust, Group(III)_Phillip_Pust_2014, "Group (III) Nitrides M[Mg2Al2N4] (M = Ca, Sr, Ba, Eu) and Ba[Mg2Ga2N4]_ Structural Relation and Nontypical Luminescence Properties of Eu2+ Doped Samples", 2014, ACS Publications, v. 26, pp. 6113-6119.*

(Continued)

*Primary Examiner* — Charles D Garber
*Assistant Examiner* — S M Sohel Imtiaz
(74) *Attorney, Agent, or Firm* — Hunton Andrews Kurth LLP

(57) ABSTRACT

A nitride fluorescent material containing at least one element selected from the group consisting of Ca, Sr, Ba and Mg, at least one element selected from the group consisting of Li, Na and K, at least one element selected from the group consisting of Eu, Ce, Tb and Mn, Al and N is provided, wherein when the maximum value of absorbance in 450 $cm^{-1}$ or more and less than 900 $cm^{-1}$ is taken as 1 in an FT-IR spectrum, an integrated value Z1 of a domain surrounded by a base line A connecting absorbance values at 1,200 $cm^{-1}$ and 1,600 $cm^{-1}$ and an absorbance spectrum of 1,200 $cm^{-1}$ or more and less than 1,600 $cm^{-1}$ is 4.0 or less, and/or an integrated value Z2 of a domain surrounded by a base line B connecting absorbance values at 2,700 $cm^{-1}$ and (Continued)

3,680 cm$^{-1}$ and an absorbance spectrum of 2,700 cm$^{-1}$ or more and less than 3,680 cm$^{-1}$ is 5.0 or less.

8 Claims, 10 Drawing Sheets

(51) Int. Cl.
  *C09K 11/02* (2006.01)
  *C09K 11/08* (2006.01)

(52) U.S. Cl.
  CPC .......... *H01L 33/502* (2013.01); *H01L 33/504* (2013.01); *H01L 33/507* (2013.01)

(56) References Cited

U.S. PATENT DOCUMENTS

| | | | | |
|---|---|---|---|---|
| 2007/0046176 | A1* | 3/2007 | Bukesov | C09K 11/08 313/496 |
| 2007/0259206 | A1* | 11/2007 | Oshio | C04B 35/581 428/690 |
| 2008/0121818 | A1* | 5/2008 | Agrawal | C09K 11/08 250/486.1 |
| 2009/0243467 | A1* | 10/2009 | Shimizu | C09K 11/7734 313/503 |
| 2010/0308712 | A1* | 12/2010 | Liu | C04B 35/58 313/503 |
| 2011/0140002 | A1* | 6/2011 | Agrawal | C09K 11/08 250/458.1 |
| 2011/0159184 | A1* | 6/2011 | Watanabe | C23C 8/08 427/248.1 |
| 2011/0220194 | A1* | 9/2011 | Kurtin | H01L 31/055 136/256 |
| 2012/0068591 | A1* | 3/2012 | Kim | C09K 11/0883 313/484 |
| 2013/0182408 | A1* | 7/2013 | Kwon | F21V 21/00 362/257 |
| 2014/0020648 | A1 | 1/2014 | Azevedo et al. | |
| 2014/0049155 | A1* | 2/2014 | Kurtin | H01L 33/502 313/512 |
| 2016/0013372 | A1* | 1/2016 | Lee | H01L 33/504 257/98 |
| 2016/0230088 | A1* | 8/2016 | Puetz | C09K 11/02 |
| 2017/0263592 | A1* | 9/2017 | Schmidt | C09K 11/02 |
| 2018/0127648 | A1* | 5/2018 | Hirosaki | C09K 11/08 |

FOREIGN PATENT DOCUMENTS

| | | | |
|---|---|---|---|
| JP | 2009132916 A | | 6/2009 |
| JP | 2011016881 A | * | 1/2011 |
| JP | 2011016881 A | * | 1/2011 |
| JP | 2015526532 A | * | 9/2015 |
| JP | 2015526532 A | * | 9/2015 |
| JP | 2015526632 A | | 9/2015 |
| JP | 2016056246 A | | 4/2016 |
| JP | 2016063001 A | | 4/2016 |
| JP | 2016088970 A | | 5/2016 |
| JP | 2016092401 A | | 5/2016 |
| JP | 2016094533 A | | 5/2016 |
| JP | 2016099520 A | | 5/2016 |
| JP | 2016111190 A | | 6/2016 |
| JP | 2016119448 A | | 6/2016 |
| JP | 2016124928 A | | 7/2016 |
| JP | 2016124929 A | | 7/2016 |
| JP | 2016132774 A | | 7/2016 |
| JP | 2016136587 A | | 7/2016 |
| JP | 2016154205 A | | 8/2016 |
| WO | 2016063965 A1 | | 4/2016 |
| WO | 2016076380 A1 | | 5/2016 |

OTHER PUBLICATIONS

Extended European Search Report dated Jan. 2, 2018 issued from the European Patent Office in corresponding Application No. 17187304.5.

Pust, et al. "Group (III) Nitrides M [Mg2Al2N4] (M = Ca, Sr, Ba, Eu) and Ba[Mg2Ga2N4] —Structural Relation and Nontypical Luminescence Properties of Eu$^2$ Doped Samples," 2014, Chemistry of Materials, American Chemical Society. 6113-6119, 7 pages.

Philipp Pust et al. "Narrow-band red-emitting Sr[LiAl3N4]:Eu2+ as a next-generation LED-phosphor material" Nature Materials, NMAT4012, vol. 13, Sep. 2014.

* cited by examiner

NITRIDE FLUORESCENT MATERIAL AND LIGHT EMITTING DEVICE

CROSS-REFERENCE TO RELATED APPLICATION

The application claims benefit of Japanese Patent Application No. 2016-163428 filed on Aug. 24, 2016, the entire disclosure of which is hereby incorporated by reference in its entirety.

BACKGROUND

Technical Field

The present disclosure relates to a nitride fluorescent material and a light emitting device using the same.

Description of Related Art

A light emitting device including a combination of a light emitting diode (hereinafter may be referred to as "LED") and a fluorescent material is frequently used in a backlight for a lighting apparatus and a liquid crystal display device, and is becoming popular. For example, in the case where a light emitting device is used in a liquid crystal display device, a fluorescent material having a narrow half bandwidth is desired to provide a wider range of color reproducibility.

Examples of such a phosphor include a red light-emitting phosphor of $SrLiAl_3N_4$:Eu (hereinafter may be referred to as "SLAN phosphor"). For example, Patent Literature 1 (PTL1) and Non-Patent Literature 1 (NPL1) (Philipp Pust et al. "Narrow-band red-emitting $Sr[LiAl_3N_4]$:$Eu^{2+}$ as a next-generation LED-phosphor material" Nature Materials, NMAT4012, vol. 13, September 2014) disclose SLAN phosphors having a narrow half bandwidth of 70 nm or less and having a peak fluorescence wavelength near 650 nm.

As disclosed in NPL1, a SLAN phosphor is, for example, produced such that powders of raw materials including lithium aluminum hydride ($LiAlH_4$), aluminum nitride (AlN), strontium hydride ($SrH_2$), and europium fluoride ($EuF_3$) are weighed in a stoichiometric ratio so that 0.4% by mol Eu is mixed. The mixture is placed in a crucible and calcined in a mixed gas atmosphere of hydrogen and nitrogen under an atmospheric pressure at a temperature of 1000° C. for two hours.

CITATION LIST

Patent Literature

PTL1: Japanese Laid-open Patent Publication No. 2015-526532

Non Patent Literature

NPL1: Philipp Pust et al. "Narrow-band red-emitting $Sr[LiAl_3N_4]$:$Eu^{2+}$ as a next-generation LED-phosphor material" Nature Materials, NMAT4012, vol. 13, September 2014.

SUMMARY

However, further improvement is required in durability of a light emitting device using a SLAN phosphor. An object of the present disclosure is to provide a nitride fluorescent material having excellent durability and a light emitting device using the same.

Means for solving the above problems are as follows, and the present disclosure includes the following embodiments.

In a first embodiment, a nitride fluorescent material has a composition containing at least one element selected from the group consisting of Ca, Sr, Ba and Mg; at least one element selected from the group consisting of Li, Na and K; at least one element selected from the group consisting of Eu, Ce, Tb and Mn; Al; and N, wherein when the maximum value of absorbance in a wavenumber domain of 450 $cm^{-1}$ or more and less than 900 $cm^{-1}$ is taken as 1 in an infrared absorption spectrum of the nitride fluorescent material measured by Fourier transform infrared spectrometer (hereinafter referred to as "FT-IR"), an integrated value Z1 of a domain surrounded by a base line A that is a straight line connecting absorbances at both ends of a wavenumber domain of from 1,200 $cm^{-1}$ to 1,600 $cm^{-1}$ and an absorbance spectrum in a wavenumber domain of 1,200 $cm^{-1}$ or more and less than 1,600 $cm^{-1}$ is 4.0 or less, and/or an integrated value Z2 of a domain surrounded by a base line B that is a straight line connecting absorbances at both ends of a wavenumber domain of from 2,700 $cm^{-1}$ to 3,680 $cm^{-1}$ and an absorbance spectrum in a wavenumber domain of 2,700 $cm^{-1}$ or more and less than 3,680 $cm^{-1}$ is 5.0 or less.

In a second embodiment, a light emitting device including the nitride fluorescent material and an excitation light source is described.

According to embodiments of the present disclosure, a nitride fluorescent material having excellent durability and a light emitting device using the nitride fluorescent material can be provided.

DETAILED DESCRIPTION

Figure 1:
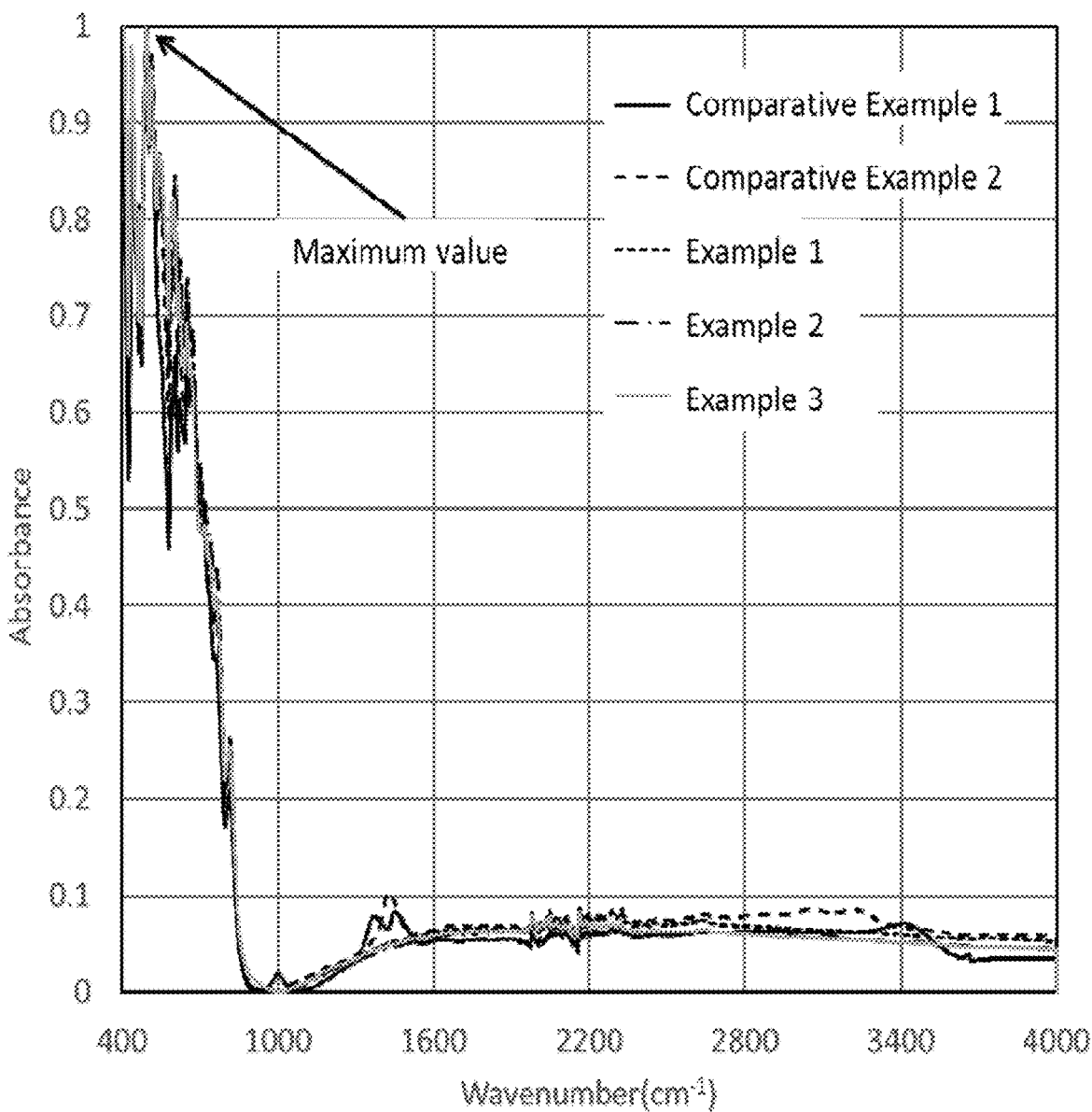
FIG. 1 is a diagram showing an infrared absorption spectrum of absorbance of nitride fluorescent materials of Examples 1 to 3 and Comparative Examples 1 and 2 to a wavenumber of from 400 $cm^{-1}$ to 4,000 $cm^{-1}$, measured by a Fourier transform infrared spectrometer.
Figure 2A:
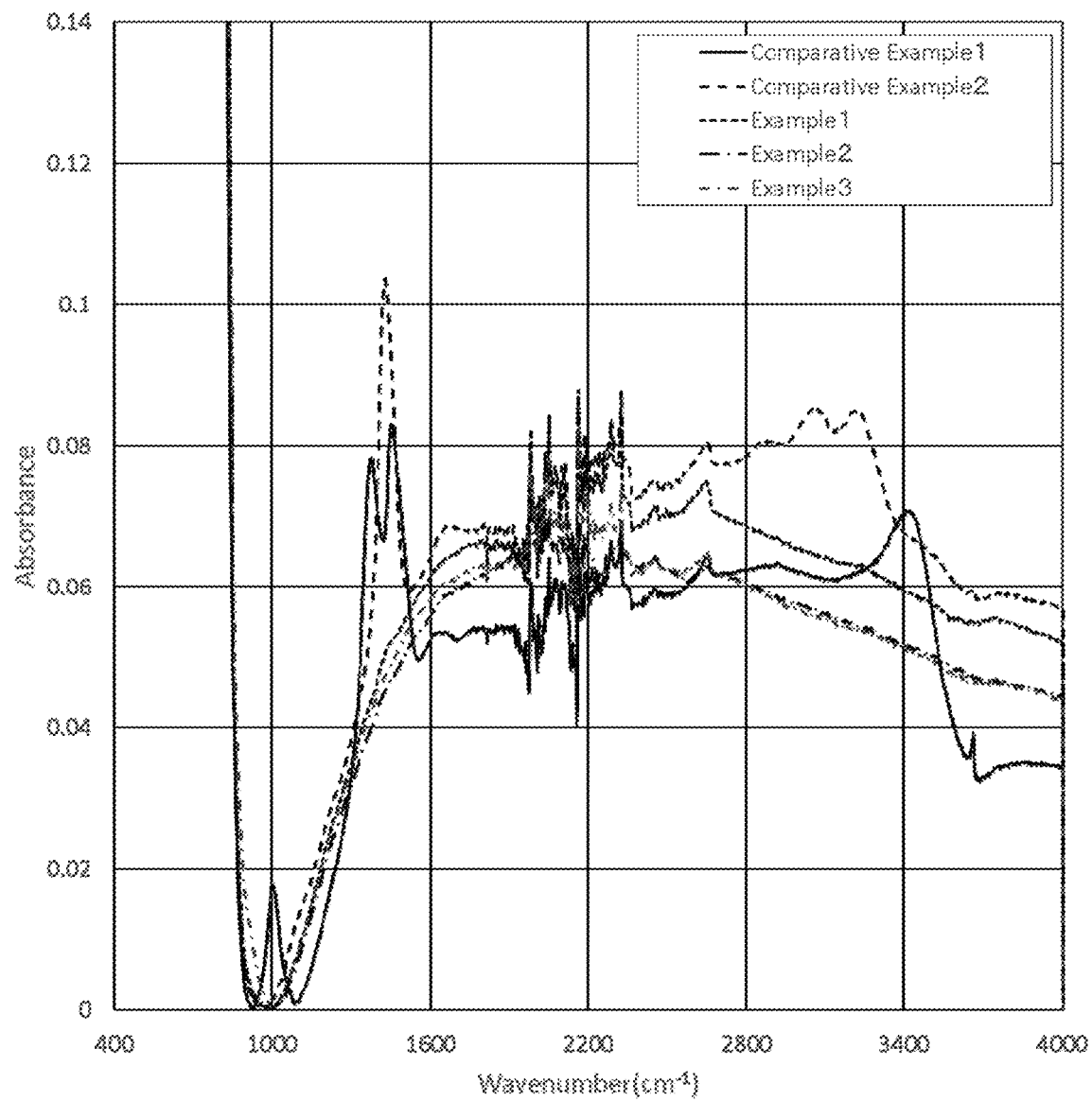
FIG. 2A is a diagram showing an infrared absorption spectrum of absorbance of each of the nitride fluorescent materials of Examples 1 to 3 and Comparative Examples 1 and 2 to a wavenumber of from 400 $cm^{-1}$ to 4,000 $cm^{-1}$, measured by a Fourier transform infrared spectrometer, with an enlarged view of an absorption spectrum in a domain of a wavenumber of from 1,000 $cm^{-1}$ to 4,000 $cm^{-1}$.
Figure 2B:
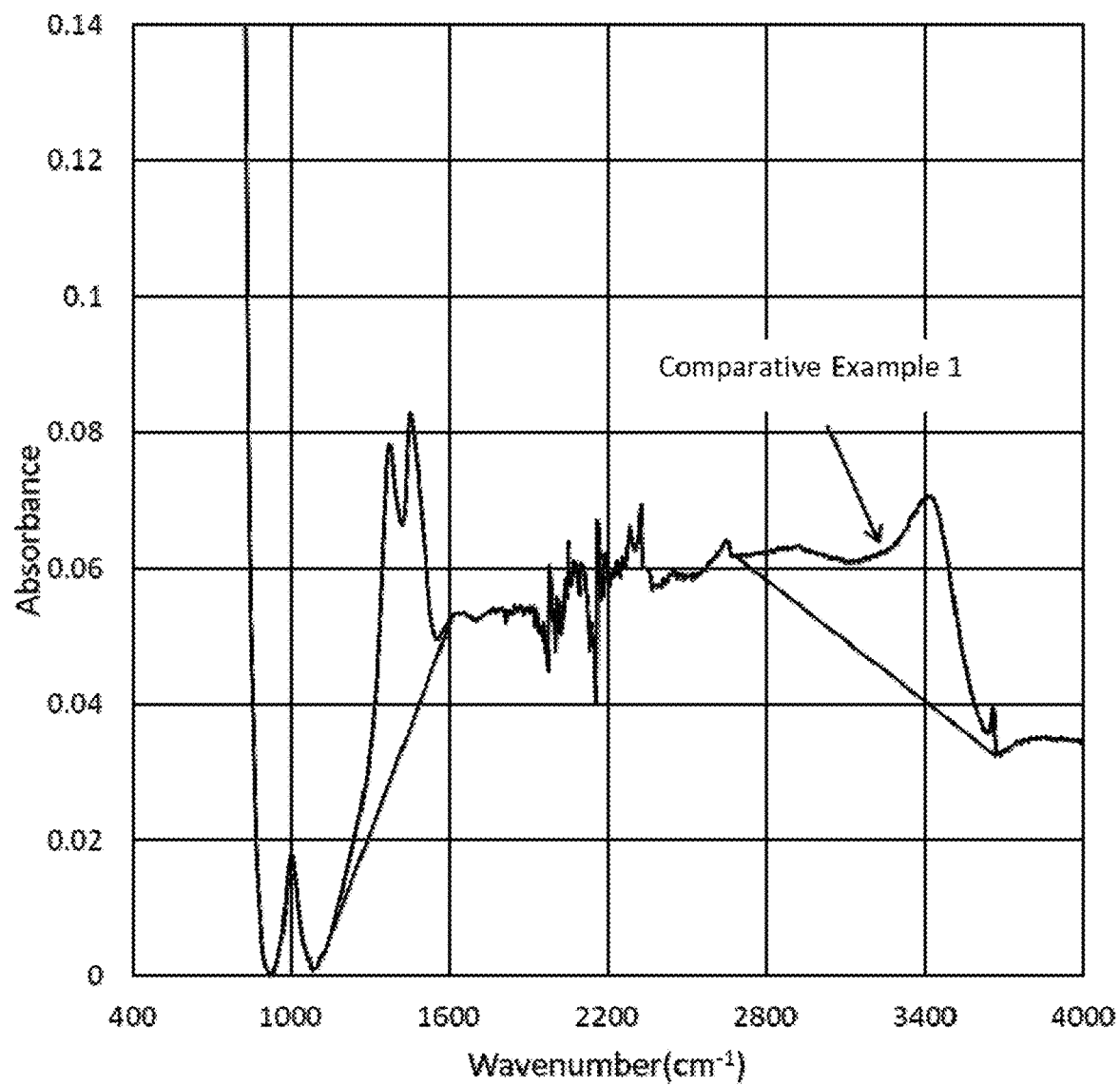
FIG. 2B is a diagram showing an infrared absorption spectrum of absorbance of the nitride fluorescent material of Comparative Example 1 to a wavenumber of from 400 $cm^{-1}$ to 4,000 $cm^{-1}$, measured by a Fourier transform infrared spectrometer, with an enlarged view of an absorption spectrum in a domain of a wavenumber of from 1,000 $cm^{-1}$ to 4,000 $cm^{-1}$.
Figure 2C:
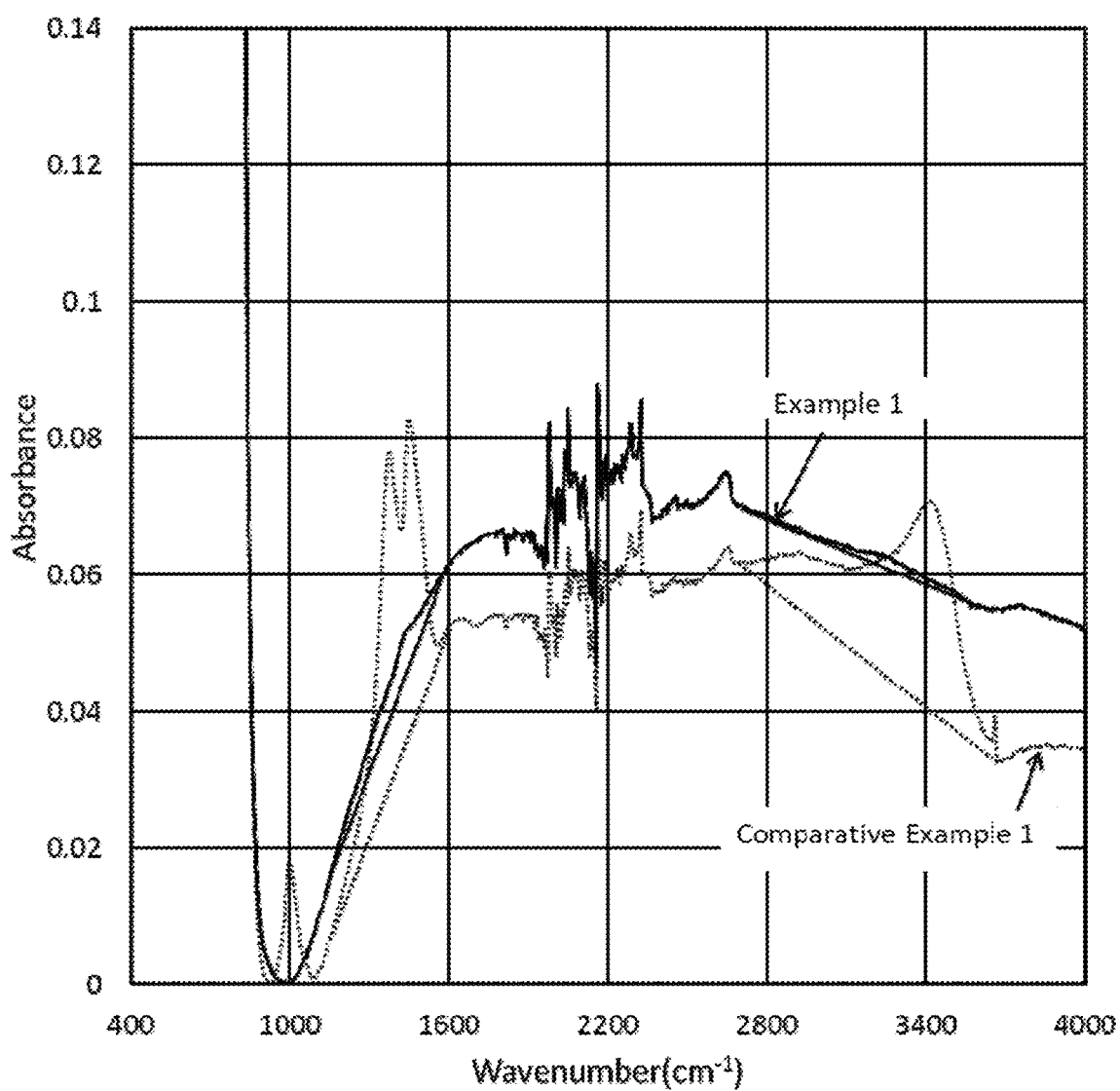
FIG. 2C is a diagram showing an infrared absorption spectrum of absorbance of each of the nitride fluorescent materials of Example 1 and Comparative Example 1 to a wavenumber of from 400 $cm^{-1}$ to 4,000 $cm^{-1}$, measured by a Fourier transform infrared spectrometer, with an enlarged view of an absorption spectrum in a domain of a wavenumber of from 1,000 $cm^{-1}$ to 4,000 $cm^{-1}$.
Figure 2D:
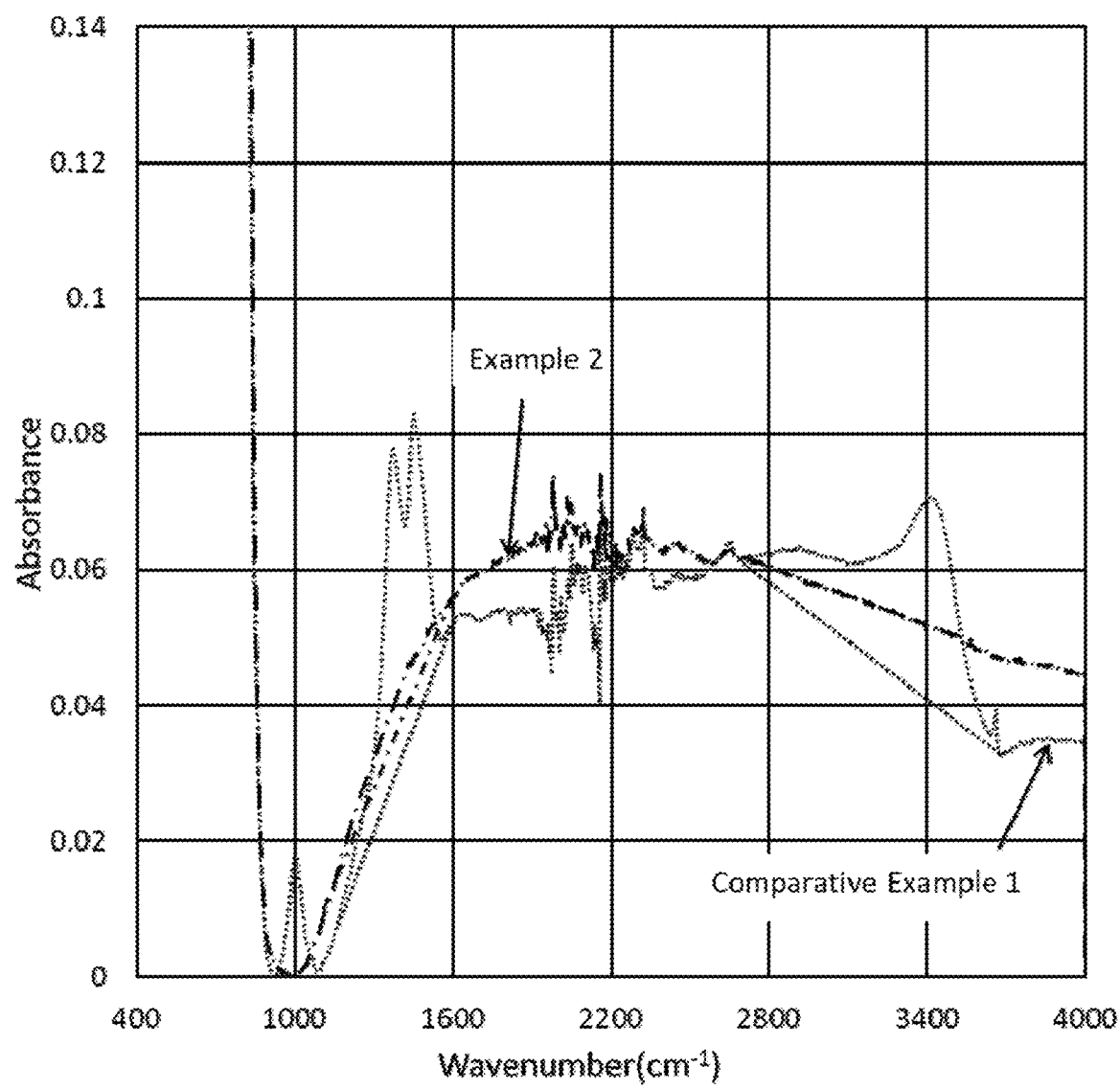
FIG. 2D is a diagram showing an infrared absorption spectrum of absorbance of each of the nitride fluorescent materials of Example 2 and Comparative Example 1 to a wavenumber of from 400 $cm^{-1}$ to 4,000 $cm^{-1}$, measured by a Fourier transform infrared spectrometer, with an enlarged view of an absorption spectrum in a domain of a wavenumber of from 1,000 $cm^{-1}$ to 4,000 cm$^{-1}$.
Figure 2E:
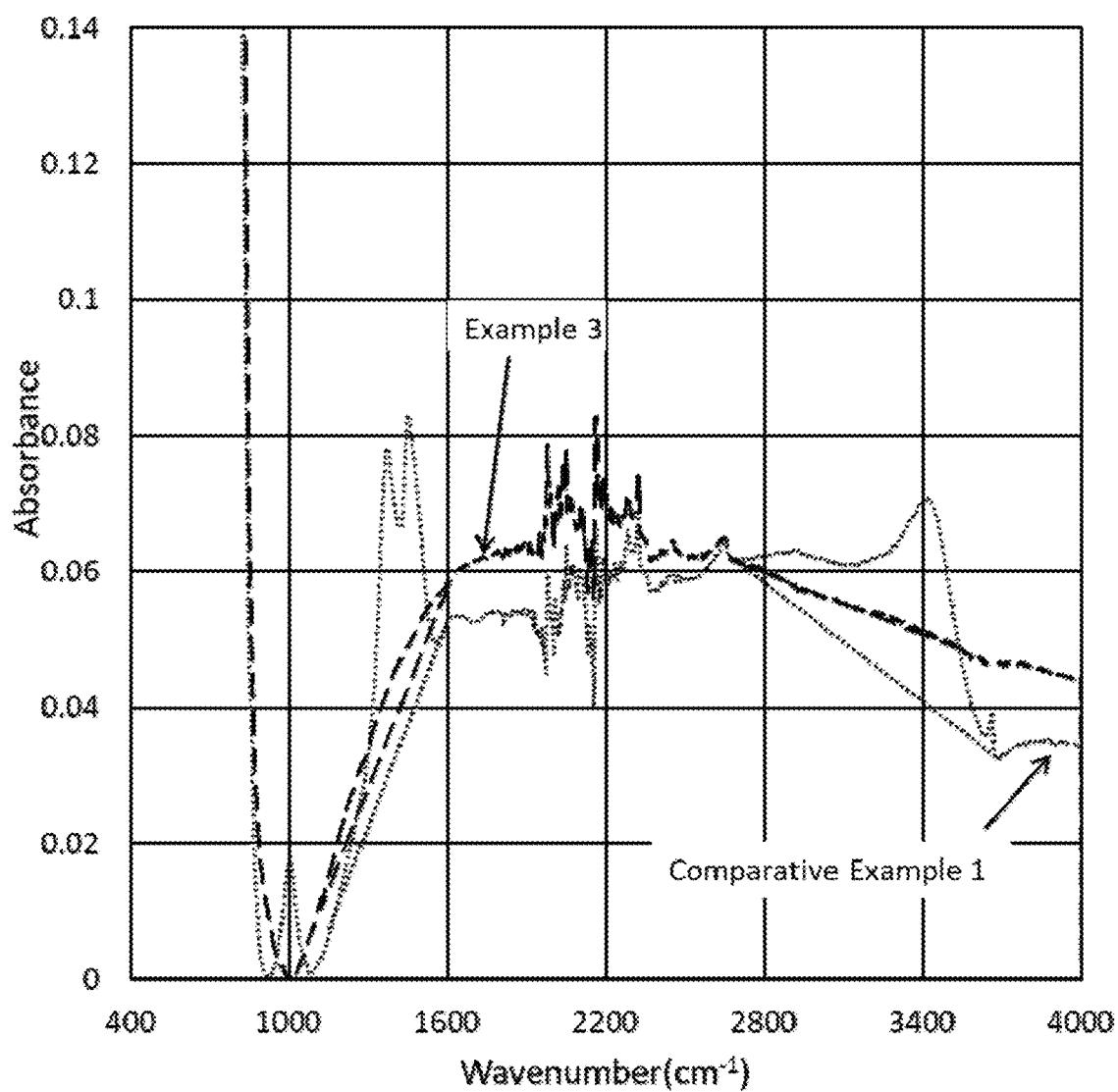
FIG. 2E is a diagram showing an infrared absorption spectrum of absorbance of each of the nitride fluorescent materials of Example 3 and Comparative Example 1 to a wavenumber of from 400 cm$^{-1}$ to 4,000 cm$^{-1}$, measured by a Fourier transform infrared spectrometer, with an enlarged view of an absorption spectrum in a domain of a wavenumber of from 1,000 cm$^{-1}$ to 4,000 cm$^{-1}$.
Figure 2F:
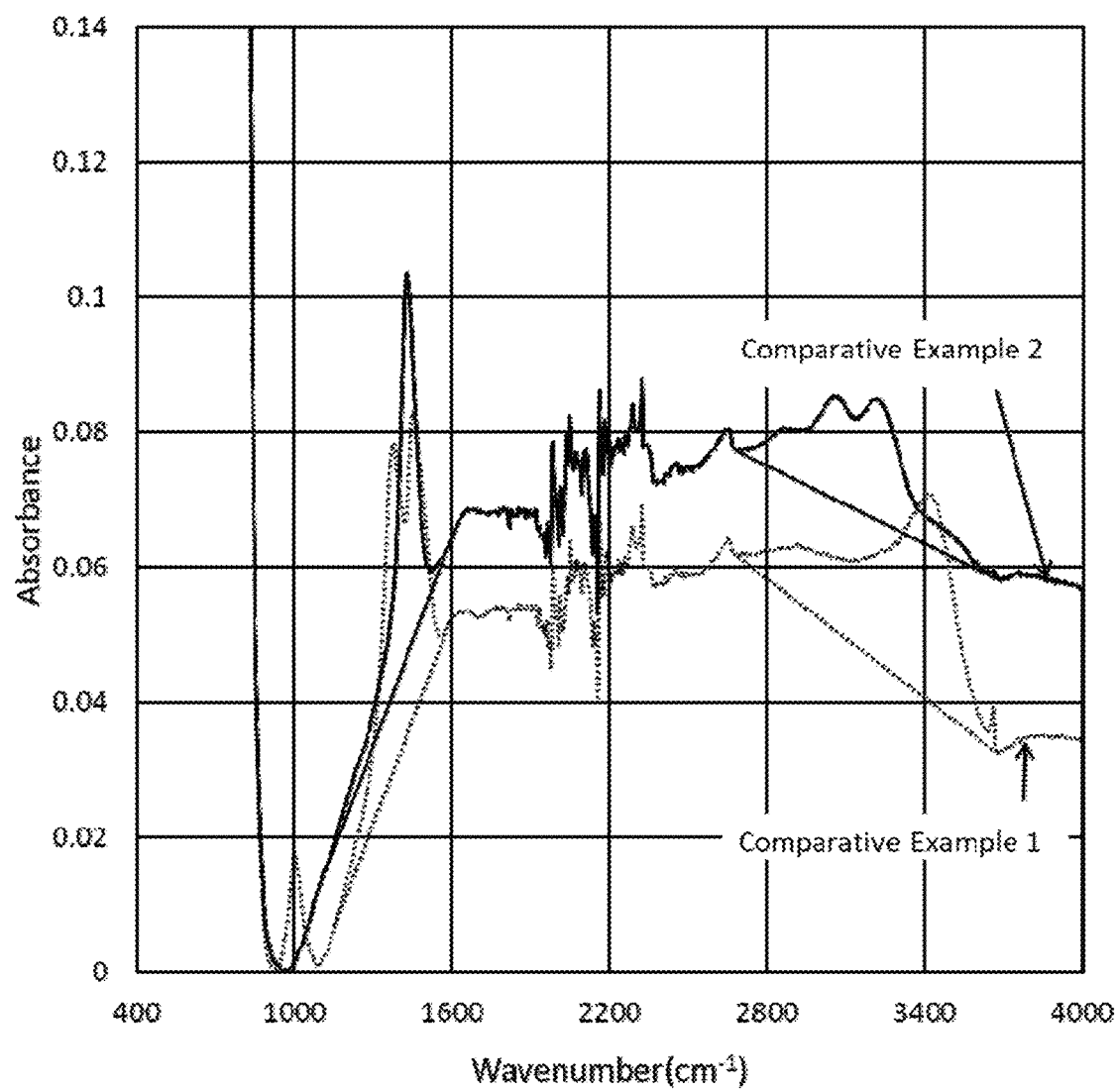
FIG. 2F is a diagram showing an infrared absorption spectrum of absorbance of each of the nitride fluorescent materials of Comparative Example 2 and Comparative Example 1 to a wavenumber of from 400 cm$^{-1}$ to 4,000 cm$^{-1}$, measured by a Fourier transform infrared spectrometer, with an enlarged view of an absorption spectrum in a domain of a wavenumber of from 1,000 cm$^{-1}$ to 4,000 cm$^{-1}$.

A nitride fluorescent material and a light emitting device according to the present disclosure will be described below based on an embodiment, respectively. However, the one embodiment described below only exemplifies a nitride fluorescent material and a light emitting device for embodying the technical concept of the present invention, and the present invention is not limited to the nitride fluorescent material and light emitting device described below. In the present specification, the relationship between the color name and the chromaticity coordinate, the relationship between the wavelength range of light and the color name of monochromatic light, and the like are in accordance with JIS Z8110. In the case where a composition contains plural substances that correspond to each component, the content of the component in the composition means the total amount of the plural substances contained in the composition unless otherwise indicated.

A nitride fluorescent material according to an embodiment is a nitride fluorescent material having a composition containing at least one element selected from the group consisting of Ca, Sr, Ba and Mg; at least one element selected from the group consisting of Li, Na and K; at least one element selected from the group consisting of Eu, Ce, Tb and Mn; Al; and N, wherein when the maximum value of absorbance in a wavenumber domain of 450 cm$^{-1}$ or more and less than 900 cm$^{-1}$ is taken as 1 in an infrared absorption spectrum of the nitride fluorescent material measured by a Fourier transform infrared spectrometer, an integrated value Z1 of a domain surrounded by a base line A that is a straight line connecting absorbances at both ends of a wavenumber domain of from 1,200 cm$^{-1}$ to 1,600 cm$^{-1}$ and an absorbance spectrum in a wavenumber domain of 1,200 cm$^{-1}$ or more and less than 1,600 cm$^{-1}$ is 4.0 or less, and/or an integrated value Z2 of a domain surrounded by a base line B that is a straight line connecting absorbances at both ends of a wavenumber domain of from 2,700 cm$^{-1}$ to 3,680 cm$^{-1}$ and an absorbance spectrum in a wavenumber domain of 2,700 cm$^{-1}$ or more and less than 3,680 cm$^{-1}$ is 5.0 or less.

A nitride fluorescent material according to an embodiment is a nitride fluorescent material having a composition containing at least one element selected from the group consisting of Ca, Sr, Ba and Mg; at least one element selected from the group consisting of Li, Na and K; at least one element selected from the group consisting of Eu, Ce, Tb and Mn; Al; and N (hereinafter referred to as "SLAN nitride fluorescent material"). The nitride fluorescent material according to an embodiment has, for example, a composition represented by the following formula (I):

$$M^a_v M^b_w M^c_x Al_{3-y} Si_y N_z \quad (I)$$

wherein M$^a$ is at least one element selected from the group consisting of Ca, Sr, Ba and Mg, M$^b$ is at least one element selected from the group consisting of Li, Na and K, M$^c$ is at least one element selected from the group consisting of Eu, Ce, Tb and Mn, and v, w, x, y and z each are numbers satisfying 0.80≤v≤1.05, 0.80≤w≤1.05, 0.001<x≤0.1, 0≤y≤0.5 and 3.0≤z≤5.0.

In an infrared absorption spectrum obtained by measuring the SLAN nitride fluorescent material with FT-IR, an absorption peak detected in a wavenumber domain of 1,200 cm$^{-1}$ or more and less than 1,600 cm$^{-1}$ is a peak originated from a carbonate group (CO$_3^{2-}$), and an absorption peak detected in a wavenumber domain of 2,700 cm$^{-1}$ or more and less than 3,680 cm$^{-1}$ is a peak originated from a hydroxyl group (OH).

The SLAN nitride fluorescent material contains at least one element selected from the group consisting of Ca, Sr, Ba and Mg, and the element located in the vicinity of the surface of the fluorescent material is easy to react with carbon dioxide, water. When the SLAN nitride fluorescent material is used in a light emitting device, the reaction with carbon dioxide, water entered from the outside of the light emitting device is more easy to be accelerated by the heat generated from an excitation light source, and the deterioration of the SLAN nitride fluorescent material easily cause changes in chromaticity of the light emitting device.

In the infrared absorption spectrum by the measurement of the SLAN nitride fluorescent material by FT-IR, when an absorption peak of an absorbance spectrum detected in a wavenumber domain of 1,200 cm$^{-1}$ or more and less than 1,600 cm$^{-1}$ is large, it can be assumed that the element located in the vicinity of the surface of the SLAN fluorescent material reacts with carbon dioxide, water, and a carbonate is formed.

In the infrared absorption spectrum of the SLAN nitride fluorescent material measured by FT-IR, when an absorption peak of an absorbance spectrum detected in a wavenumber domain of 2,700 cm$^{-1}$ or more and less than 3,680 cm$^{-1}$ is large, it can be assumed that the element located on the surface or in the vicinity of the surface of the SLAN nitride fluorescent material reacts with water, and a hydroxide is formed.

In the infrared absorption spectrum of the SLAN nitride fluorescent material measured by FT-IR, when an absorption peak of an absorbance spectrum in a wavenumber domain of 1,200 cm$^{-1}$ or more and less than 1,600 cm$^{-1}$ and an absorption peak of an absorbance spectrum in a wavenumber domain of 2,700 cm$^{-1}$ or more and less than 3,680 cm$^{-1}$ are small, it can be assumed that the influence by the reaction of the element such as Sr constituting the SLAN nitride fluorescent material with carbon dioxide, water is small as compared with a fluorescent material having large absorption peaks in those wavenumber domains.

The size of an absorption peak in a specific wavenumber domain can be measured by comparing, when the maximum value of absorbance in a wavenumber domain of 450 cm$^{-1}$ or more and less than 900 cm$^{-1}$ is taken as 1 in an infrared absorption spectrum of the nitride fluorescent material measured by a Fourier transform infrared spectrometer, an integrated value Z1 of a domain surrounded by a base line A that is a straight line connecting absorbances at both ends of a wavenumber domain of from 1,200 $cm^{-1}$ to 1,600 $cm^{-1}$ and an absorbance spectrum in a wavenumber domain of 1,200 $cm^{-1}$ or more and less than 1,600 $cm^{-1}$, and/or an integrated value Z2 of a domain surrounded by a base line B that is a straight line connecting absorbances at both ends of a wavenumber domain of from 2,700 $cm^{-1}$ to 3,680 $cm^{-1}$ and an absorbance spectrum in a wavenumber domain of 2,700 $cm^{-1}$ or more and less than 3,680 $cm^{-1}$.

The integrated value Z1 is obtained as follows. When the overall integrated value of an absorption spectrum in a wavenumber domain of 1,200 $cm^{-1}$ or more and less than 1,600 $cm^{-1}$ is $Z0_1$, an integrated value $Zt_2$ of a nearly trapezoidal area below the base line A of an absorbance spectrum in a wavenumber domain of 1,200 $cm^{-1}$ or more and less than 1,600 $cm^{-1}$ is removed as a background from the overall integrated value Z01, thereby removing variation factors appeared on the spectrum. Thus, the stable integrated value Z1 can be obtained.

The integrated value Z2 is obtained as follows. When the overall integrated value of an absorption spectrum in a wavenumber domain of 2,700 $cm^{-1}$ or more and less than 3,680 $cm^{-1}$ is Z02, an integrated value $Zt_2$ of a nearly trapezoidal area below the base line B of an absorbance spectrum in a wavenumber domain of 2,700 $cm^{-1}$ or more and less than 3,680 $cm^{-1}$ is removed as a background from the overall integrated value Z02, thereby removing variation factors appeared on the spectrum. Thus, the stable integrated value Z2 can be obtained.

For example, when a calcined product constituting the SLAN nitride fluorescent material is brought into contact with a fluorine-containing substance in the production of the SLAN nitride fluorescent material, it is assumed that a carbonate group in a carbonate and a hydroxyl group in a hydroxide, formed by reacting the element such as Sr constituting the calcined product with carbon dioxide, water, are substituted with fluorine in the vicinity of the surface of the calcined product. Formation of a carbonate and a hydroxide is suppressed, and the SLAN nitride fluorescent material obtained is not greatly influenced by the reaction with carbon dioxide, water. Furthermore, when a calcined product constituting the SLAN nitride fluorescent material is brought into contact with a fluorine-containing substance in the production of the SLAN nitride fluorescent material, an element such as Sr constituting the calcined product reacts with fluorine, and a fluorine-containing compound is formed on the surface in a film form. When such a SLAN nitride fluorescent material is obtained, the film containing the fluorine-containing compound functions as a protective film. When the SLAN nitride fluorescent material having the fluorine-containing compound formed in a film form is used in a light emitting device, the reaction of the SLAN nitride fluorescent material with carbon dioxide, water that entered the inside of the light emitting device is suppressed, and the change of chromaticity caused by the progress of the reaction can be suppressed.

When the integrated value Z1 of the domain surrounded by the base line A and the absorbance spectrum in the wavenumber domain of 1,200 $cm^{-1}$ or more and less than 1,600 $cm^{-1}$ is 4.0 or less, and/or when the integrated value Z2 of the domain surrounded by the base line B and the absorbance spectrum in the wavenumber domain of 2,700 $cm^{-1}$ or more and less than 3,680 $cm^{-1}$ is 5.0 or less, it is indicated that the influence by the reaction of the element constituting the SLAN nitride fluorescent material with carbon dioxide, water and the like is small. Even when this SLAN nitride fluorescent material is used in a light emitting device, the reaction of the element constituting the SLAN nitride fluorescent material with carbon dioxide, water and the like that entered the light emitting device is difficult to progress to a certain extent or more, and it can be confirmed that in the SLAN nitride fluorescent material, a change of chromaticity caused by the influence by such a reaction is suppressed and that high durability is obtained.

In the SLAN nitride fluorescent material according to one embodiment of the present invention, the integrated value Z1 is preferably 2.0 or less, more preferably 1.5 or less, still more preferably 1.4 or less, and still more preferably 1.3 or less. The integrated value Z1 is generally 0.1 or more.

The integrated value Z2 is preferably 4.0 or less, more preferably 3.0 or less, still more preferably 2.0 or less, still more preferably 1.0 or less, and still more preferably 0.5 or less. The integrated value Z2 is generally 0.05 or more.

The SLAN nitride fluorescent material according to an embodiment is preferably that the integrated value Z1 is 4.0 or less and the integrated value Z2 is 5.0 or less.

When the integrated value Z1 is 4.0 or less and the integrated value Z2 is 5.0 or less, it can be confirmed that an alkaline earth metal (Ca, Sr, Ba or Mg) or an alkali metal (Li, Na or K) constituting the SLAN nitride fluorescent material is suppressed from reacting with any of carbon dioxide.

The SLAN nitride fluorescent material according to an embodiment preferably has the composition represented by the formula (I) and the content of elemental fluorine in a range of 1% by mass or more and 7% by mass or less.

In the SLAN nitride fluorescent material according to an embodiment, a part of N may be substituted with O on the surface of or inside the fluorescent material.

The SLAN nitride fluorescent material according to an embodiment has the integrated value Z1 of 4.0 or less, the integrated value Z2 of 5.0 or less and the composition represented by the formula (I), and contains elemental fluorine in an amount in a range of 1% by mass or more and 7% by mass or less. It is assumed in the SLAN nitride fluorescent material that the element constituting a fluorescent material in the vicinity of the surface of the fluorescent material reacts with fluorine and a fluorine-containing compound is formed in a film form. The SLAN nitride fluorescent material according to an embodiment is that the film containing the fluorine-containing compound functions as a protective film, thereby making it difficult to react the inside of the SLAN nitride fluorescent material with carbon dioxide, water, and difficult to receive the influence of external environment. As a result, when the SLAN nitride fluorescent material is provided in a light emitting device, durability of the light emitting device can be enhanced.

In the SLAN nitride fluorescent material according to one embodiment of the present invention, the content of elemental fluorine is preferably in a range of 2% by mass or more and 7% by mass or less, and more preferably in a range of 3% by mass or more and 7% by mass or less.

When the content of elemental fluorine is within the above range, the film containing the fluorine-containing compound formed in the vicinity of the surface of the fluorescent material can be functioned as a protective film.

When the content of elemental fluorine in the SLAN nitride fluorescent material is less than 1% by mass, the content of elemental fluorine is too small, and the function of a protective film by the fluorine-containing compound cannot be developed, and there is a case that durability cannot be enhanced. When the content of elemental fluorine in the SLAN nitride fluorescent material exceeds 7% by mass, elements including the Ma element, Mb element and Al that form a crystal structure react with oxygen (O), fluorine (F) to form a compound different from the compound forming a crystal structure containing those elements in the crystal structure constituting the SLAN nitride fluorescent material, and when the SLAN nitride fluorescent material is used in a light emitting device, chromaticity may change.

In the formula (I), $M^a$ preferably contains at least one of Ca and Sr from the standpoint of enhancement of emission intensity. When $M^a$ contains at least one of Ca and Sr, the total mole fraction of Ca and Sr contained in $M^a$ is, for example, 85% by mol or more, and preferably 90% by mol or more.

$M^b$ preferably contains at least Li from the standpoint of stability of a crystal structure. When $M^b$ contains Li, the mole fraction of Li contained in $M^b$ is, for example, 80% by mol or more, and preferably 90% by mol or more.

Regarding the parameters v, w, x, y and z in the formula (I), the parameter v is preferably in a range of 0.80 or more and 1.05 or less, and more preferably in a range of 0.90 or more and 1.03 or less, from the standpoint of stability of a crystal structure. The parameter x is an activation amount of at least one element selected from the group consisting of Eu, Ce, Tb and Mn, and is appropriately selected so as to achieve desired characteristics. The parameter x satisfies more preferably $0.001<x\leq0.020$, and still more preferably $0.002\leq x\leq0.015$.

The SLAN nitride fluorescent material absorbs light in a wavelength range of 400 nm or more and 570 nm or less that is a short wavelength side region of from ultraviolet rays to visible light and emits fluorescence having an emission peak wavelength in a range of 630 nm or more and 670 nm or less. Use of an excitation light source in the wavelength range can provide a fluorescent material having high emission intensity. Particularly, an excitation light source having a main emission peak wavelength in a range of 420 nm or more and 500 nm or less is preferably used, and an excitation light source having a main emission peak wavelength in a range of 420 nm or more and 460 nm or less is more preferably used.

The emission spectrum of the SLAN nitride fluorescent material has an emission peak wavelength in a range of 630 nm or more and 670 nm or less, and preferably has an emission peak wavelength in a range of 640 nm or more and 660 nm or less. The half value width of the emission spectrum is, for example, 65 nm or less, and preferably 60 nm or less. This can provide a light emitting device having a wide color reproduction range. The lower limit of the full width at half maximum is, for example, preferably 45 nm or more.

In the SLAN nitride fluorescent material, at least one element selected from the group consisting of Eu, Ce, Tb and Mn is an emission center. In the SLAN nitride fluorescent material, for example, europium (Eu) as a rare earth element is an emission center. However, the emission center of the SLAN nitride fluorescent material is not limited to only europium. Even when Eu is an emission center, a part of Eu may be substituted with other rare earth metal or alkaline earth metal, and a fluorescent material in which the substituted metal has been coactivated with Eu can be used. $Eu^{2+}$ as a divalent rare earth ion is stably present by selecting an appropriate base material, and emits light.

The SLAN nitride fluorescent material has an average particle diameter of, for example, 4.0 μm or more, preferably 4.5 μm or more, and more preferably 5.0 μm or more. The average particle diameter is, for example, 20 μm or less, and preferably 18 μm or less. When the average particle diameter is a predetermined value or more, emission intensity can be increased. On the other hand, when the average particle diameter is a predetermined value or less, workability in a manufacturing process of a light emitting device can be enhanced.

When the average particle diameter is a predetermined value or more, absorbance of excitation light into a nitride fluorescent material and emission intensity tend to further increase. Thus, when a nitride fluorescent material having excellent emission characteristic is contained in a light emitting device described hereinafter, emission efficiency of the light emitting device increases. Furthermore, when the average particle diameter is a predetermined value or less, workability in a manufacturing process of a light emitting device can be enhanced.

In the present specification, the average particle diameter of a fluorescent material is a volume average particle diameter, and a particle diameter (median size) was measured by using a laser diffraction-type particle-size distribution measuring device MASTER SIZER 2000, manufactured by Malvern Instrument Ltd.).

Light Emitting Device

Figure 7:
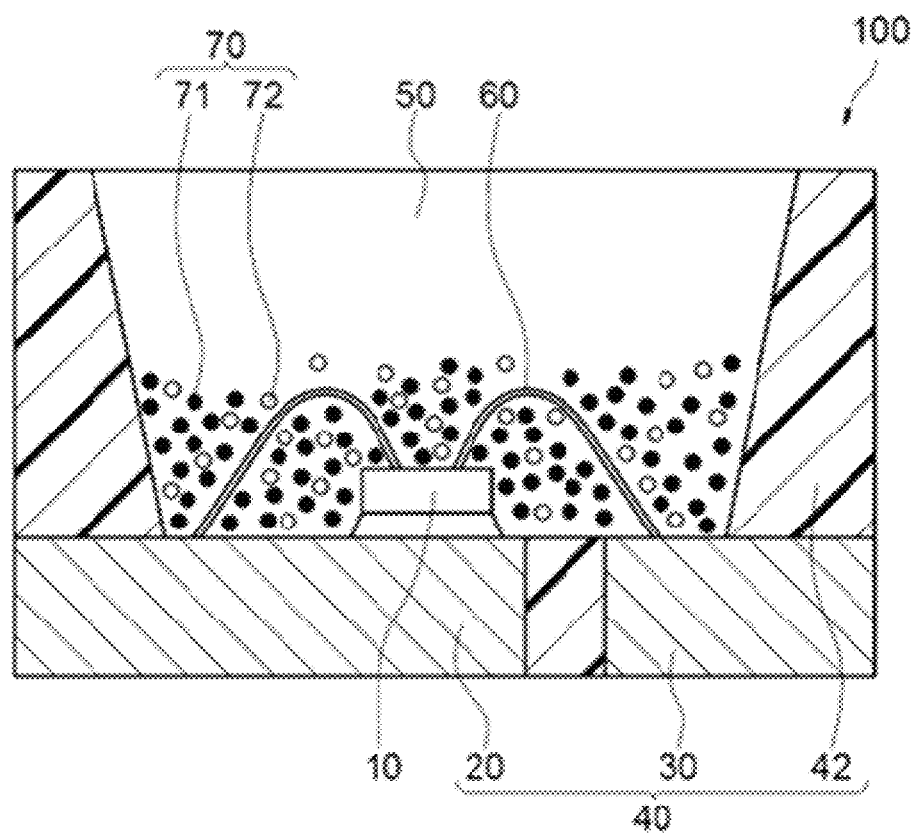
FIG. 7 is a schematic cross-sectional view showing one example of a light emitting device.

The light emitting device according to one embodiment of the present disclosure is described below. FIG. 7 is a schematic cross-sectional view showing a light emitting device 100 of the embodiment. The light emitting device 100 includes at least a first fluorescent material 71 containing an SLAN nitride fluorescent material according to the embodiment, and an excitation light source emitting light in a wavelength range of 400 nm or more and 570 nm or less.

The light emitting device 100 includes a molded article 40, a light emitting element 10 and a fluorescent member 50. The molded article 40 includes a first lead 20 and a second lead 30 that are integrally molded with a resin portion 42 containing a thermoplastic resin or a thermosetting resin. The molded article 40 forms a depression having a bottom and sides, and the light emitting element 10 is placed on the bottom of the depression. The light emitting element 10 has a pair of an anode and a cathode, and the pair of the anode and the cathode are electrically connected to the first lead 20 and the second lead 30 respectively through the respective wires 60. The light emitting element 10 is covered with the fluorescent member 50. The fluorescent member 50 includes, for example, a fluorescent material 70 performing wavelength conversion of light from the light emitting element 10, and a resin. The fluorescent material 70 includes a first fluorescent material 71 and a second fluorescent material 72. The first lead 20 and the second lead 30 that are connected to a pair of the anode and the cathode of the light emitting element 10 are arranged in such a way that a part of the first lead 20 and the second lead 30 is exposed toward outside a package constituting the light emitting element 100. The light emitting device 100 can emit light by receiving electric power supply from the outside through the first lead 20 and the second lead 30.

The light emitting element 10 is used as an excitation light source, and preferably has an emission peak wavelength in a range of 400 nm or more and 570 nm or less. The excitation light source not only can use a part of the light emission for exciting a fluorescent material, but can use as output light of a light emitting device. The light emitting element 10 has an emission peak wavelength in a range of more preferably 420 nm or more and 500 nm or less, and still more preferably 420 nm or more and 460 nm or less. The nitride fluorescent material according to the embodiment is efficiently excited by light from the excitation light source having an emission peak wavelength in such a wavelength range, and makes it possible to constitute the light emitting device 100 emitting a mixed light of the light from the light emitting element 10 and the fluorescence from the fluorescent material 70.

The full width at half maximum of the emission spectrum of the light emitting element can be, for example, 30 nm or less.

The light emitting element preferably uses a semiconductor light emitting element using a nitride semiconductor ($In_XAl_YGa_{1-X-Y}N$, $0 \leq X$, $0 \leq Y$, $X+Y \leq 1$). When the semiconductor light emitting element is used as a light source, a stable light emitting device having high linearity of output to input with high efficiency and being strong against mechanical shocks can be obtained.

The content of the first fluorescent material 71 can be, for example, 1 part by mass or more and 50 parts by mass or less, and is preferably 2 parts by mass or more and 40 parts by mass or less, per 100 parts by mass of the resin.

The fluorescent member 50 preferably contains the second fluorescent material 72 having an emission peak wavelength different from that of the first fluorescent material 71. For example, the light emitting device 100 can be the light emitting device 100 having a wide color reproduction range and a high color rendering property by appropriately having the light emitting element 10 emitting light having an emission peak wavelength in a wavelength range of 380 nm or more and 485 nm or less, and the first fluorescent material 71 and second fluorescent material 72 containing the nitride fluorescent material according to one embodiment of the present invention excited by the light.

Examples of the second fluorescent material 72 include fluorescent materials having any of the compositions represented by the following formulae (IIa) to (IIi), and it is preferred to contain at least one fluorescent material having a composition represented by the formula selected from the group consisting of those formulae. For example, it is more preferred to contain at least one fluorescent material having a composition represented by the formula (IIc), (IIe) or (IIi) from the standpoint of providing a wide range of color reproducibility. Furthermore, it is more preferred to contain at least one fluorescent material having a composition represented by the formula (IIa), (IId), (IIf) or (IIg) from the standpoint of obtaining high color rendering property.

$(Y,Gd,Tb,Lu)_3(Al,Ga)_5O_{12}:Ce$ (IIa)

$(Ba,Sr,Ca)_2SiO_4:Eu$ (IIb)

$Si_{6-p}Al_pO_pN_{8-p}:Eu (0<p\leq4.2)$ (IIc)

$(Ca,Sr)_8MgSi_4O_{16}(Cl,F,Br)_2:Eu$ (IId)

$(Ba,Sr,Ca)Ga_2S_4:Eu$ (IIe)

$(Ba,Sr,Ca)_2Si_5N_8:Eu$ (IIf)

$(Sr,Ca)AlSiN_3:Eu$ (IIg)

$K_2(Si,Ge,Ti)F_6:Mn$ (IIh)

$(Ba,Sr)MgAl_{10}O_{17}:Mn$ (IIi)

The second fluorescent material 72 has an average particle diameter of preferably 2 μm or more and 35 μm or less, and more preferably 5 μm or more and 30 μm or less. When the average particle diameter is the predetermined value or more, emission intensity can be enhanced. Furthermore, when the average particle diameter is the predetermined value or less, workability can be improved in the manufacturing process of the light emitting device.

The content of the second fluorescent material 72 can be, for example, in a range of 1 part by mass or more and 200 parts by mass or less, and is preferably in a range of 2 parts by mass or more and 180 parts by mass or less, per 100 parts by mass of the resin.

The content ratio of the first fluorescent material 71 can be, for example, in a range of 0.01 or more and 5 or less, and is preferably in a range of 0.05 or more and 3 or less, as a mass ratio to the second fluorescent material 72.

The fluorescent material 70 can constitute the fluorescent member 50 covering the light emitting element, together with the resin. Examples of the resin constituting the fluorescent member 50 include thermosetting resins such as a silicone resin and an epoxy resin.

The total content of the fluorescent material 70 in the fluorescent member 50 can be, for example, in a range of 5 parts by mass or more and 300 parts by mass or less, and is preferably in a range of 10 parts by mass or more and 250 parts by mass or less, more preferably in a range of 15 parts by mass or more and 230 parts by mass or less, and still more preferably in a range of 15 parts by mass or more and 200 parts by mass or less, per 100 parts by mass of the resin. When the content of the fluorescent material 70 in the fluorescent member 50 is within the above range, a wavelength conversion of the light emitted from the light emitting element 10 can be efficiently performed by the fluorescent material 70.

The fluorescent member 70 may further include a filler, a light diffusion material and the like. For example, when the fluorescent member contains a light diffusion material, directionality from the light emitting element 10 is relaxed, and a viewing angle can be enlarged. Examples of the filler include silica, titanium oxide, zinc oxide, zirconium oxide and alumina. When the fluorescent member 50 contains a filler, the content of the filler can be, for example, in a range of 1 part by mass or more and 20 parts by mass or less, per 100 parts by mass of the resin.

Manufacturing Method of Nitride Fluorescent Material

The nitride fluorescent material according to an embodiment of the present disclosure can be manufactured by preparing a calcined product having a composition containing at least one element selected from the group consisting of Ca, Sr, Ba and Mg, at least one element selected from the group consisting of Li, Na and K, at least one element selected from the group consisting of Eu, Ce, Tb and Mn, Al and N (the composition is hereinafter referred to as "SLAN composition"), bringing the calcined product into contact with a fluorine-containing substance, and heat-treating the resulting product at a temperature of 200° C. or higher and 500° C. or lower.

The calcined product having the SLAN composition can be obtained by mixing raw materials so as to have the SLAN composition, and then calcining the raw material mixture obtained at a temperature of 1,000° C. or higher and 1,300° C. or lower under a pressure in a range of 0.2 MPa or more and 200 MPa or less in an atmosphere containing a nitrogen gas.

Examples of the raw materials include a metal, an alloy or a compound (a first metal compound), containing at least one element selected from the group consisting of Ca, Sr, Ba and Mg; a metal, an alloy or a compound (a second metal compound), containing at least one element selected from the group consisting of Li, Na and K; a metal, an alloy or a compound (a fourth metal compound), containing at least one element selected from the group consisting of Eu, Ce, Tb and Mn; and a metal, an alloy or a compound (a third metal compound), containing Al. Examples of the compounds include a hydride, a nitride, a fluoride, an oxide, a carbonate, and a chloride. At least one selected from the group consisting of a hydride, a nitride and a fluoride is preferred from the standpoint of enhancing light emitting characteristics.

Examples of the first metal compound as the raw material specifically include $SrN_2$, SrN, $Sr_3N_2$, $SrH_2$, $SrF_2$, $Ca_3N_2$, $CaH_2$ and $CaF_2$, and at least one selected from the group consisting of those compounds is preferred.

Examples of the second metal compound specifically include $Li_3N$, $LiN_3$, LiH and $LiAlH_4$, and at least one selected from the group consisting of those compounds is preferred. The second metal compound may be used in one kind alone or as mixtures of two or more kinds thereof.

Examples of the third metal compound specifically include AlN, $AlH_3$, $AlF_3$ and $LiAlH_4$, and at least one selected from the group consisting of those compounds is preferred. The third metal compound may be used in one kind alone or as mixtures of two or more kinds thereof.

When Si is contained in a part of Al in the composition of the calcined product, a metal compound containing Si as an elemental metal is preferably used. Examples of the metal compound containing Si include $SiO_2$, $Si_3N_4$, SiC and $SiCl_4$, and at least one selected from the group consisting of those compounds can be used. The compound containing Si may be used in one kind alone or as mixtures of two or more kinds thereof.

Examples of the fourth metal compound specifically include $Eu_2O_3$, EuN and $EuF_3$, and at least one selected from the group consisting of those compounds is preferred. The calcined product used in the nitride fluorescent material according to the present embodiment contains divalent Eu as a center of light emission. However, the divalent Eu is easy to be oxidized, and the raw material mixture may be constituted with a metal compound containing trivalent Eu.

When the fourth metal compound is Eu, a part of Eu may be substituted with Sc, Y, La, Ce, Pr, Nd, Sm, Gd, Tb, Dy, Ho, Er, Tm, Yb, Lu or the like. It is considered that when a part of Eu is substituted with another element, the other element acts as, for example, a coactivator. When the nitride fluorescent material is coactivated, color tone can be changed, and light emission characteristics can be adjusted. When a mixture containing Eu as an essential component is used as a nitride fluorescent material, the blending ratio can be changed as desired. Europium mainly has divalent and trivalent energy levels. The calcined product used in the nitride fluorescent material according to the present embodiment uses at least $Eu^{2+}$ as an activator.

The raw material mixture may contain flux. When the raw material mixture contains flux, the reaction among raw materials is further accelerated, and additionally a solid phase reaction proceeds more uniformly. As a result, a calcined product used for obtaining a nitride fluorescent material having a large particle diameter and more excellent light emission characteristics can be manufactured. When the raw material mixture contains flux, a flux component promotes reactivity, but an excessive amount thereof leads to the deterioration of emission intensity. For this reason, the content of flux is, for example, preferably 10% by mass or less, and more preferably 5% by mass or less, based on the mass of the raw material mixture.

The raw material mixture is calcined at a temperature in a range of preferably 1,000° C. or higher and 1,400° C. or lower in a nitrogen gas atmosphere, thereby a calcined product can be obtained. The nitrogen gas atmosphere is an atmosphere containing a nitrogen gas, and can be an atmosphere containing at least one selected from the group consisting of hydrogen, argon, carbon dioxide, carbon monoxide, ammonia and the like in addition to the nitrogen gas. The nitrogen gas atmosphere is that the proportion of the nitrogen gas is preferably 70% by volume or more, and more preferably 80% by volume or more. The calcining is preferably conducted under a pressurized atmosphere in a range of 0.2 MPa or more and 200 MPa or less.

The SLAN nitride fluorescent material is that by bringing the calcined product into contact with a fluorine-containing substance and heat-treating at a temperature in a range of 200° C. or higher and 500° C. or lower, an element such as Sr constituting the calcined product in the vicinity of the surface of the calcined product reacts with carbon dioxide or water, a carboxyl group in a carbonate formed and a hydroxyl group in a hydroxide thus formed are substituted with fluorine, and formation of a carbonate and a hydroxide is suppressed. Furthermore, in the SLAN nitride fluorescent material, by bringing the calcined product into contact with a fluorine-containing substance and subjecting the obtaining product to heat-treating as described above, the fluorine-containing compound is formed in a film form in the vicinity of the surface. The fluorine-containing substance is preferably at least one selected from the group consisting of $F_2$, $CHF_3$, $CF_4$, $NH_4F_2$, $NH_4F$, $SiF_4$, $KrF_2$, $XeF_2$, $XeF_4$ and $NF_3$, and more preferably fluorine gas ($F_2$) or ammonium fluoride ($NH_4F$).

The environmental temperature for bringing the calcined product into contact with the fluorine-containing substance in a solid state or a liquid state at ordinary temperature may be a temperature in a range of from room temperature (20° C.±5° C.) to a temperature lower than the heat treatment temperature, and may be the heat treatment temperature. Specifically, the environmental temperature may be a temperature in a range of 20° C. or higher and 500° C. or lower, and preferably may be a temperature in a range of 20° C. or higher and lower than 200° C. When the environmental temperature for bringing the calcined product into contact with the fluorine-containing substance in a solid state at ordinary temperature is in a range of 20° C. or higher and lower than 200° C., the heat treatment is preferably conducted several times. Furthermore, when the environmental temperature for bringing the calcined product into contact with the fluorine-containing substance in a solid state at ordinary temperature is in a range of 20° C. or higher and lower than 100° C., it is preferred that the calcined product is brought into contact with the fluorine-containing substance, and then heat-treated at a temperature in a range of 200° C. or higher and 500° C. or lower. When the heat treatment is conducted at a temperature of a temperature higher than room temperature and lower than 200° C., the heat treatment time is preferably in a range of 1 hour or longer and 10 hours or shorter for each treatment.

When the fluorine-containing substance is a gas, it is preferred that the calcined product is placed in an atmosphere containing the fluorine-containing substance to bring the calcined product into contact with the fluorine-containing substance, and then heat-treated at a temperature in a range of 200° C. or higher and 500° C. or lower. The time continuously conducting the heat treatment at a temperature in a range of 200° C. or higher and 500° C. or lower is preferably 1 hour or longer and 10 hours or shorter.

When the fluorine-containing substance is $F_2$ (fluorine gas) and the calcined product is heat-treated at a temperature in a range of 200° C. or higher and 500° C. or lower in an atmosphere containing $F_2$, the $F_2$ concentration in the atmosphere is preferably in a range of 2% by volume or more and 25% by volume or less.

The heat treatment is preferably conducted in an inert gas atmosphere. The inert gas atmosphere used herein means an atmosphere including argon, helium, nitrogen or the like as a main component. The inert gas atmosphere may sometimes contain oxygen as an unavoidable impurity. In the present invention, when the concentration of oxygen in the atmosphere is 15% by volume or less, such an atmosphere is called the inert gas atmosphere. The oxygen concentration in the inert gas atmosphere is preferably 10% by volume or less, and particularly preferably 1% by volume or less. Specifically, the SLAN nitride fluorescent material according to one embodiment of the present invention can be manufactured by the method described in Japanese Patent Application No. 2016-037616.

EXAMPLES

Some aspect of the present invention will be described more specifically with reference to examples shown below.
Production of Calcined Product A fluorescent material having a composition containing Sr, Li, Eu, Al and N was produced.

Specifically, a fluorescent material having the composition represented by the formula (I) $M^a{}_v M^b{}_w M^c{}_x Al_{3-y} Si_y N_z$, wherein $M^a$ is Sr, $M^b$ is Li and $M^c$ is Eu was obtained as follows. $SrN_u$ (wherein u corresponds to ⅔, a mixture of $Sr_2N$ and SrN), $SrF_2$, $LiAlH_4$, AlN and $EuF_3$ were used as raw materials, and weighed in a glove box of an inert gas atmosphere such that a molar ratio of those as a charged amount ratio is Sr:Li:Eu:Al:N=0.9925:1.2:0.0075:3:4, followed by mixing. Thus, a raw material mixture was obtained. The weight ratio of $SrN_u$ to $SrF_2$ was 94:6. Li is easy to scatter during calcining. Therefore, Li was used in an amount slightly larger than the theoretical value. The raw material mixture obtained was placed in a crucible, and heat-treated at a temperature of 1,100° C. under a gas pressure of 0.92 MPa as a gauge pressure (1.02 MPa as an absolute pressure) for 3 hours in a nitrogen gas atmosphere to obtain a calcined product having a composition represented by $Sr_{0.9925}LiEu_{0.0075}Al_3N_4$. The calcined product was then subjected to dispersion and classification treatments to obtain a calcined product 1.

Example 1

The calcined product 1 was heat-treated at a temperature of 350° C. for a treatment time of 8 hours in an atmosphere containing a fluorine gas ($F_2$) and a nitrogen gas ($N_2$) wherein the fluorine gas concentration is 20% by volume and the nitrogen gas concentration is 80% by volume. Thus, a powder of SLAN nitride fluorescent material of Example 1 was obtained.

Comparative Example 1

The calcined product 1 was used as SLAN nitride fluorescent material of Comparative Example 1.

Example 2

A powder of SLAN nitride fluorescent material of Example 2 was obtained under the same conditions as in Example 1, except that the heat treatment for 8 hours was repeated three times under the same initial conditions of each heat treatment as the conditions of Example 1 except for changing the heat treatment temperature to 150° C.

Example 3

A powder of SLAN nitride fluorescent material of Example 3 was obtained under the same conditions as in Example 1, except that the fluorine gas concentration was 10% by volume and the heat treatment temperature was 400° C.

Comparative Example 2

A powder of SLAN nitride fluorescent material of Comparative Example 2 was obtained under the same conditions as in Example 1, except that the heat treatment temperature was 150° C.

Evaluation
Infrared Absorption Spectrum Measured by Fourier Transform Infrared Spectrometer Infrared absorption spectra of the nitride fluorescent materials were measured using a Fourier transform infrared spectrometer (FT-IR) (product name: Nicoleti S50, manufactured by Thermo Fisher Scientific Inc.). The results obtained are shown in FIG. 1. When the maximum of absorbance in a wavenumber domain of 450 $cm^{-1}$ or more and less than 900 $cm^{-1}$ in the infrared absorption spectrum of each nitride fluorescent material measured using the FT-IR is taken as 1, an integrated value Z1 of a domain surround by a base line A that is a straight line connecting absorbance values at both ends of a wavenumber domain of from 1,200 $cm^{-1}$ to 1,600 $cm^{-1}$ and an absorbance spectrum in a wavenumber domain of 1,200 $cm^{-1}$ or more and less than 1,600 $cm^{-1}$ and an integrated value Z2 of a domain surrounded by a base line B that is a straight line connecting absorbance values at both ends of a wavenumber domain of from 2,700 $cm^{-1}$ to 3,680 $cm^{-1}$ and an absorbance spectrum in a wavenumber domain of 2,700 $cm^{-1}$ or more and less than 3,680 $cm^{-1}$ were obtained.

Specifically, when the maximum of absorbance in a wavenumber domain of 450 $cm^{-1}$ or more and less than 900 $cm^{-1}$ in the infrared absorption spectrum of each nitride fluorescent material is taken as 1, the overall integrated value $Z0_1$ of an absorbance spectrum in a wavenumber domain of 1,200 $cm^{-1}$ or more and less than 1,600 $cm^{-1}$ is calculated. Next, a straight line connecting absorbance values at both ends of the wavenumber domain of from 1,200 $cm^{-1}$ to 1,600 $cm^{-1}$ is defined as a base line A. An integrated value $Zt_1$ of a nearly trapezoidal area surrounded by a straight line connecting the absorbance value 0 to the absorbance value at the wavenumber of 1,200 $cm^{-1}$, the base line A and a straight line connecting the absorbance value 0 to the absorbance value at the wavenumber of 1,600 $cm^{-1}$ is calculated as a background. Finally, the integrated value Z1 of a domain surrounded by the base line A and the absorbance spectrum in the wavenumber domain of 1,200 $cm^{-1}$ or more and less than 1,600 $cm^{-1}$ was calculated to be the difference obtained by removing the integrated value $Zt_1$ as the background from the integrated value $Z0_1$.

When the maximum of absorbance in a wavenumber domain of 450 $cm^{-1}$ or more and less than 900 $cm^{-1}$ in the infrared absorption spectrum of each nitride fluorescent material is taken as 1, the overall integrated value $Z0_2$ of an absorbance spectrum in a wavenumber domain of 2,700 $cm^{-1}$ or more and less than 3,680 $cm^{-1}$ is calculated. Next, a straight line connecting absorbance values at both ends of the wavenumber domain of from 2,700 $cm^{-1}$ to 3,680 $cm^{-1}$ is defined as a base line B. An integrated value $Zt_2$ of a nearly trapezoidal area surrounded by a straight line connecting the absorbance value 0 to the absorbance value at the wavenumber of 2,700 cm$^{-1}$, the base line B and a straight line connecting the absorbance value 0 to the absorbance value at the wavenumber of 3,680 cm$^{-1}$ is calculated as a background. Finally, the integrated value Z2 of a domain surrounded by the base line B and an absorbance spectrum in the wavenumber domain of 2,700 cm$^{-1}$ or more and less than 3,680 cm$^{-1}$ was calculated to be the difference obtained by removing the integrated value $Zt_2$ as the background from the integrated value Z02.

The infrared spectrum using FT-IR was measured as that wavenumber resolution is 4.0 cm$^{-1}$ and the cumulated number is 32.

Content of Elemental Fluorine

Composition analysis of the nitride fluorescent materials were performed by ICP atomic emission spectroscopy using an inductively coupled plasma atomic emission spectrophotometer (manufactured by Perkin Elmer), and the contents of elemental fluorine in the nitride fluorescent materials were obtained. The contents (% by mass) of the elemental fluorine in the nitride fluorescent materials are shown in Table 1.

Storage Test

Light emitting devices were produced using the nitride fluorescent materials, respectively. A nitride semiconductor light emitting element having a main wavelength of 451 nm was covered with the fluorescent material 50 containing a silicone resin having dispersed therein the nitride fluorescent material of each of examples and comparative examples as the first fluorescent material 71 and β sailon that is a green fluorescent material as the second fluorescent material 72 to manufacture a surface-mounted light emitting device 100 having chromaticity (x, y) of around (0.250, 0.220). This light emitting device was stored at a temperature of 85° C. and a relative humidity of 85% for 100 hours. Thereafter, chromaticity x was measured and obtained as the change amount (absolute value) to the chromaticity x before the storage test. The results obtained are shown in Table 1.

SEM Image

Figure 3:
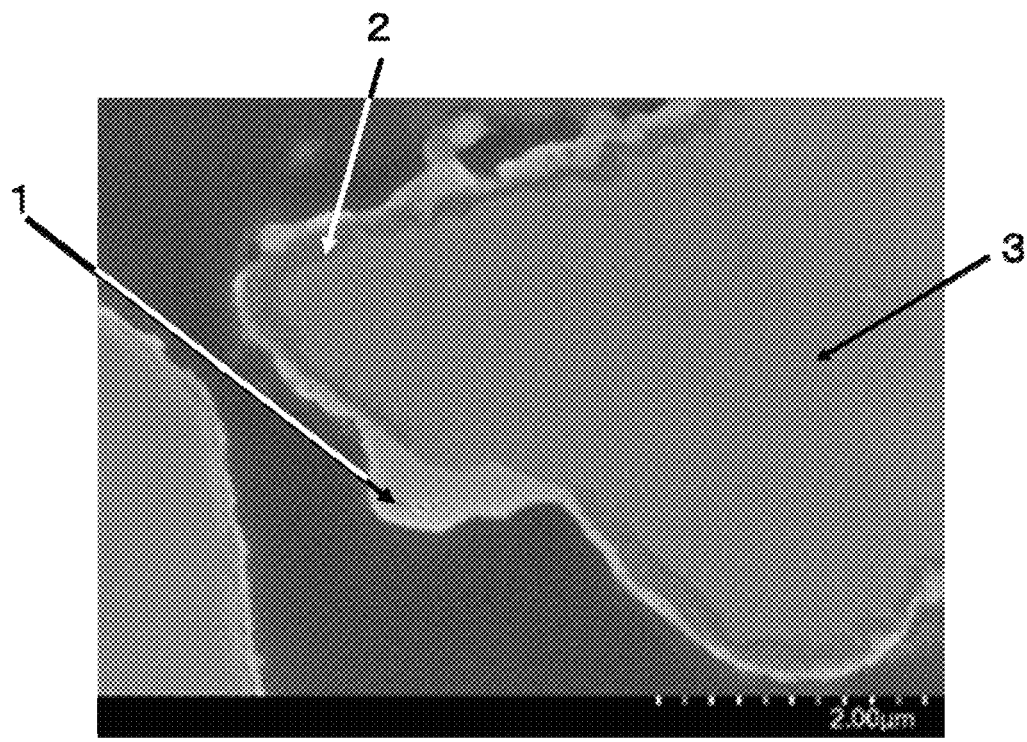
FIG. 3 is an enlarged SEM micrograph of a cross-section of a nitride fluorescent material of Example 1.
Figure 4:
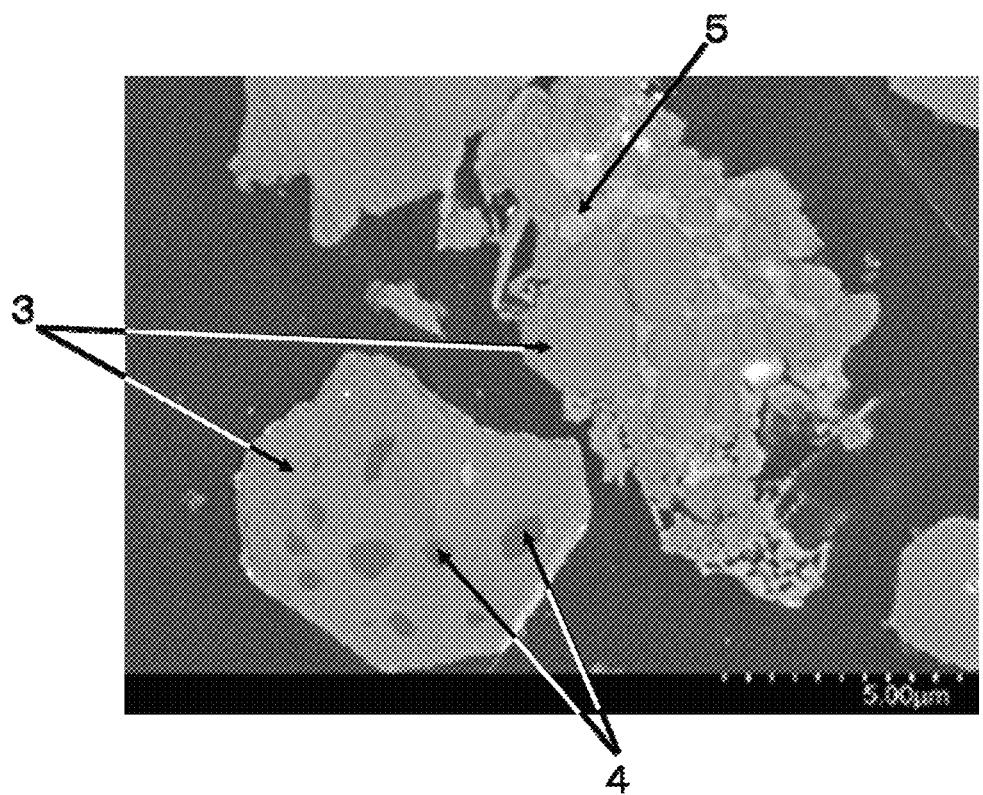
FIG. 4 is a SEM micrograph showing a cross-section of a nitride fluorescent material of Example 1.
Figure 5:
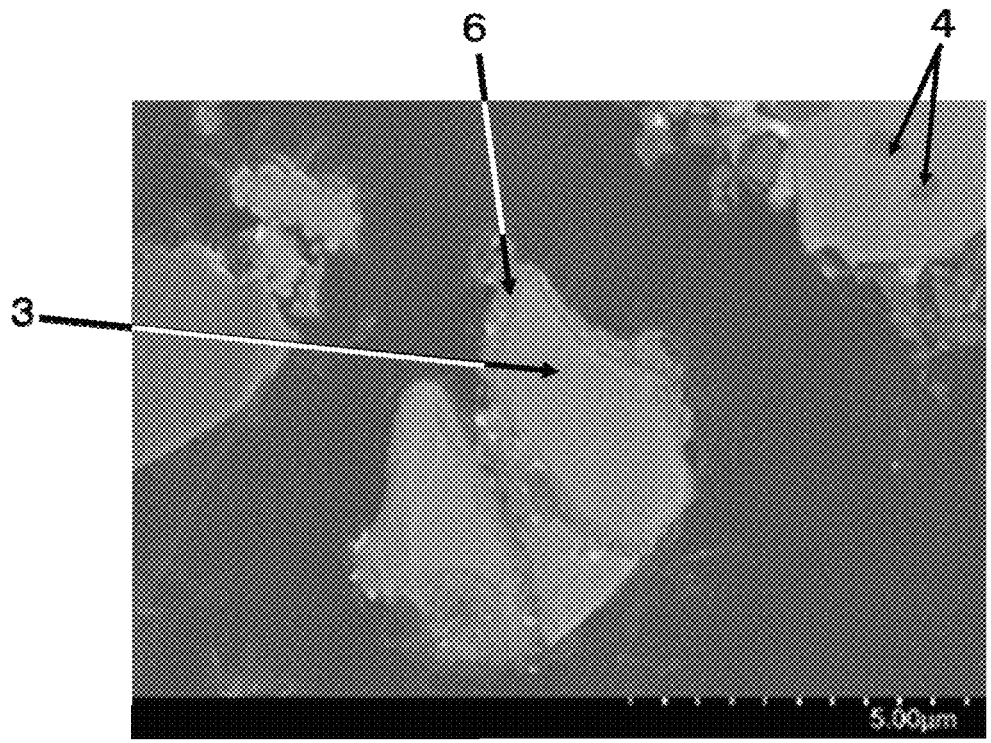
FIG. 5 is a SEM micrograph showing a cross-section of a nitride fluorescent material of Comparative Example 1.
Figure 6:
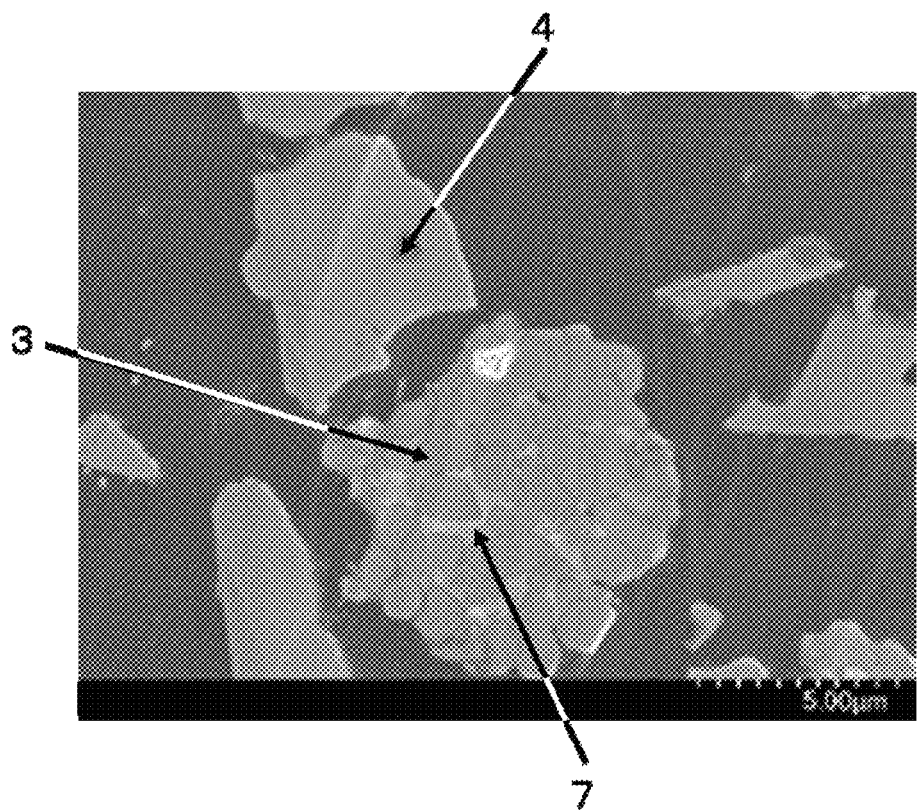
FIG. 6 is a SEM micrograph showing a cross-section of a nitride fluorescent material of Comparative Example 2.

The nitride fluorescent materials were embedded in an epoxy resin and grounded such that a cross-section of the nitride fluorescent material was exposed, and the surface was polished with a sandpaper. The surface was finished with a cross-section polisher (CP), and a cross-sectional SEM image of each nitride fluorescent material of Example 1 and Comparative Examples 1 and 2 was obtained using a scanning electron microscope (SEM). FIG. 3 is an enlarged SEM micrograph of a cross-section of the nitride fluorescent material of Example 1, and FIG. 4 is a SEM micrograph showing a cross-section of the nitride micrograph of Example 1. FIG. 5 is a SEM micrograph showing a cross-section of the nitride fluorescent material of Comparative Example 1. FIG. 6 is a SEM micrograph showing a cross-section of the nitride fluorescent material of Comparative Example 2.

Average Particle Diameter

The average particle diameter of the nitride fluorescent materials were measured by a laser diffraction particle size analyzer (product name: MASTER SIZER 2000, manufactured by MALVERN). The average particle diameter is a volume average particle diameter (median size). The results obtained are shown in Table 1, The contact conditions between the calcined products of Examples and Comparative Examples and the fluorine-containing substance, and the heat treatment conditions are shown in Table 1.

TABLE 1

| | Contact conditions and contact time to fluorine-containing substance | | | Average particle diameter (μm) | Fluorine content (% by mass) | Integrated value of infrared absorption spectrum | | Chromaticity x change amount |
| --- | --- | --- | --- | --- | --- | --- | --- | --- |
| | Contact temperature | Atmosphere | Contact time | | | Z1 (1,200 cm$^{-1}$ or more and less than 1,600 cm$^{-1}$) | Z2 (2,700 cm$^{-1}$ or more and less than 3,680 cm$^{-1}$) | |
| Comparative Example 1 | — | — | — | 10.4 | 0.6 | 7.7 | 11.9 | 0.028 |
| Comparative Example 2 | 150° C. | F$_2$: 20% by volume | 8 hours | 10.2 | 7.5 | 4.9 | 7.1 | 0.026 |
| Example 1 | 350° C. | | 8 hours | 11.3 | 6.7 | 1.2 | 0.1 | 0.000 |
| Example 2 | 150° C. | | 8 hours × 3 times | 10.4 | 6.8 | 1.2 | 0.1 | 0.000 |
| Example 3 | 400° C. | F$_2$: 10% by volume | 8 hours | 11.8 | 5.6 | 1.1 | 0.4 | 0.000 |

The nitride fluorescent materials of Examples 1 to 3 were that when the maximum value of absorbance in a wavenumber domain of 450 cm$^{-1}$ or more and less than 900 cm$^{-1}$ is taken as 1 in an infrared absorption spectrum measured by FT-IR, the integrated value Z1 of a domain surrounded by the base line A and the absorbance spectrum in a wavenumber domain of 1,200 cm$^{-1}$ or more and less than 1,600 cm$^{-1}$ was 4.0 or less, and the integrated value Z2 of a domain surrounded by the base line B and the absorbance spectrum in a wavenumber domain of 2,700 cm$^{-1}$ or more and less than 3,680 cm$^{-1}$ was 5.0 or less. It can be confirmed from the results that the nitride fluorescent materials of Examples 1 to 3 are not greatly influenced by the reaction with carbon dioxide, water. It could be confirmed that the light emitting device using each of the nitride fluorescent materials of Examples 1 to 3 is a light emitting device having small change of chromaticity x after storage as compared with comparative Examples, and having improved durability.

On the other hand, in the nitride fluorescent materials of Comparative Examples 1 and 2, the integrated value Z1 exceeds 4.0 and additionally the integrated value Z2 exceeds 5.0. It was therefore assumed from those facts that the influence by the reaction of an element constituting the nitride fluorescent material with carbon dioxide, water is large. The light emitting devices using the nitride fluorescent materials of Comparative Examples 1 and 2 show large changes in chromaticity x, and therefore had a problem in durability.

The nitride fluorescent materials of Examples 1 to 3 have a composition of $Sr_{0.9925}LiEu_{0.075}Al_3N_4$ and a fluorine content in a range of 1% by mass or more and 7% by mass or less, and as described above, the light emitting devices using the nitride fluorescent materials of Examples 1 to 3 exhibited small changes in chromaticity x after storage. The fluorine-containing compound that can be confirmed by SEM micrographs described hereinafter is formed in a film form in the vicinity of the surface of the nitride fluorescent materials of Examples 1 to 3, and it was considered that the film containing the fluorine-containing compound functions as a protective film.

As shown in FIGS. 1 and 2, when the maximum value of absorbance in a wavenumber domain of 450 $cm^{-1}$ or more and less than 900 $cm^{-1}$ is taken as 1 in an infrared absorption spectrum measured by FT-IR, a particularly remarkable peak could not be confirmed in a wavenumber domain of 1,200 $cm^{-1}$ or more and less than 1,600 $cm^{-1}$ and a wavenumber domain of 2,700 $cm^{-1}$ or more and less than 3,680 $cm^{-1}$ in the nitride fluorescent materials of Examples 1 to 3.

On the other hand, as shown in FIGS. 1 and 2, when the maximum value of absorbance in a wavenumber domain of 450 $cm^{-1}$ or more and less than 900 $cm^{-1}$ is taken as 1 in an infrared absorption spectrum measured by FT-IR, it could be confirmed that relatively large peaks originated from a carbonate group ($CO_3^{2-}$) and a hydroxyl group (OH) are present in a wavenumber domain of 1,200 $cm^{-1}$ or more and less than 1,600 $cm^{-1}$ and a wavenumber domain of 2,700 $cm^{-1}$ or more and less than 3,680 $cm^{-1}$ in the nitride fluorescent materials of Comparative Examples 1 and 2. It can be assumed from the results that in the nitride fluorescent materials of Comparative Examples 1 and 2, an element in the vicinity of the surface reacts with carbon dioxide and/or water, and a carbonate and/or a hydroxide is formed.

As can be confirmed from an enlarged SEM micrograph of a cross-section of the nitride fluorescent material of Example 1 shown in FIG. 3, the first film 1 containing a compound containing fluorine and one element (for example, elemental Sr) constituting the nitride fluorescent material was formed on the surface of the nitride fluorescent material of Example 1, and the second film 2 containing elements (for example, Sr, N and F (fluorine)) constituting the nitride fluorescent material was formed on a lower layer of the first film 1. The first film and the second film containing the fluorine-containing compounds function as protective films. As such, elements constituting the nitride fluorescent material, for example, alkaline earth metals (Ca, Sr, Ba and Mg) or alkali metals (Li, Na and K) are difficult to react with carbon dioxide and/or water in the vicinity of the surface of the nitride phosphor, and the influence by the reaction with carbon dioxide and/or water is decreased. It is therefore considered that durability of the SLAN nitride fluorescent material is improved. In the SEM micrograph of the cross-section of the nitride fluorescent material of Example 1 shown in FIG. 4, it is considered that the reference numeral 3 is a crystal of the SLAN nitride fluorescent material (SLAN crystal) and the reference numeral 4 is a crystal of aluminum nitride (AlN crystal). Furthermore, it is considered that the first compound shown by the reference numeral 5 is a compound including elements constituting a nitride fluorescent material, for example, Sr and Al, and further oxygen (O) and fluorine (F).

As can be confirmed from a SEM micrograph of a cross-section of the nitride fluorescent material of Comparative Example 1 shown in FIG. 5, a third film 6 of a compound including elements constituting the nitride fluorescent material, for example, oxygen (O) reacted with Sr and Al, and nitrogen (N) was formed on the surface of the nitride fluorescent material of Comparative Example 1. Thus, in the nitride fluorescent material of Comparative Example 1, the influence by the reaction of elements constituting the nitride fluorescent material in the vicinity of the surface thereof with carbon dioxide and/or water is large, deterioration of the nitride fluorescent material proceeds, and as shown in Table 1, the change of chromaticity x after storage is increased. It was therefore assumed that durability of the nitride fluorescent material is poor as compared with that of the nitride fluorescent materials of Examples 1 to 3.

It cannot be confirmed from a SEM micrograph of a cross-section of the nitride fluorescent material of Comparative Example 2 shown in FIG. 6 that a film is formed on the surface of the nitride fluorescent material, and it could be confirmed that a second compound 7 containing elements constituting the nitride fluorescent material, different from the SLAN crystal 3 or AlN crystal 4, for example, Sr, Al and nitrogen (N), and further containing oxygen (O) and nitrogen (N) is formed in the particles of the nitride fluorescent material. In the nitride fluorescent material of Comparative Example 2, as shown in Table 1, a compound in which elements constituting the crystal structure of the nitride fluorescent material have reacted with oxygen, fluorine is formed in the particles of the nitride fluorescent material, thereby decomposition of the nitride fluorescent material proceeds. It was therefore assumed that the change of chromaticity x is large.

From the results shown in Table 1, the nitride fluorescent material according to an embodiment of the present disclosure suppresses the change of color tone even after storage under the environment described above. Thus, the nitride fluorescent material according to an embodiment of the present disclosure has excellent durability. Therefore, a light emitting device having high reliability can be provided by using the nitride fluorescent material.

A light emitting device using the nitride fluorescent material of the present disclosure can be suitably used in particularly light sources for lighting having extremely excellent emission characteristics using a light emitting diode as an excitation light source, LED displays, backlight light sources for crystal, signals, switches for lighting, various sensors, and various indicators.

What is claimed is:
1. A nitride fluorescent material comprising a composition represented by the following formula (I) and having a content of elemental fluorine in a range of 1% by mass or more and 7% by mass or less, and a carbonate and a hydroxide in the vicinity of a surface of the nitride fluorescent material:

$$M^a{}_v M^b{}_w M^c{}_x Al_{3-y} Si_y N_z \qquad (I)$$

wherein
$M^a$ is at least one element selected from the group consisting of Ca, Sr, Ba and Mg,
$M^b$ is at least one element selected from the group consisting of Li, Na and K,
$M^c$ is at least one element selected from the group consisting of Eu, Ce, Tb and Mn, and
v, w, x, y and z each are numbers satisfying $0.80 \leq v \leq 1.05$, $0.80 \leq w \leq 1.05$, $0.001 < x \leq 0.1$, $0 \leq y \leq 0.5$ and $3.0 \leq z \leq 5.0$,
wherein when the maximum value of absorbance in a wavenumber domain of 450 $cm^{-1}$ or more and less than 900 $cm^{-1}$ is taken as 1 in an infrared absorption spectrum of the nitride fluorescent material measured by a Fourier transform infrared spectrometer, an integrated value Z1 of a domain surrounded by a base line A that is a straight line connecting absorbance values at both ends of a wavenumber domain of from 1,200 $cm^{-1}$ to 1,600 $cm^{-1}$ and an absorbance spectrum in a wavenumber domain of 1,200 cm$^{-1}$ or more and less than 1,600 cm$^{-1}$ is 0.1 or more and 4.0 or less, or an integrated value Z2 of a domain surrounded by a base line B that is a straight line connecting absorbance values at both ends of a wavenumber domain of from 2,700 cm$^{-1}$ to 3,680 cm$^{-1}$ and an absorbance spectrum in a wavenumber domain of 2,700 cm$^{-1}$ or more and less than 3,680 cm$^{-1}$ is 0.05 or more and 0.5 or less, or the integrated value Z1 is 0.1 or more and 4.0 or less and the integrated value Z2 is 0.05 or more and 0.5 or less, the integrated value Z1 is originated from a carbonate group in the carbon and the integrated value Z2 is originated from a hydroxyl group in the hydroxide.

2. The nitride fluorescent material according to claim 1, wherein the integrated value Z1 is 0.1 or more and 4.0 or less, and the integrated value Z2 is 0.05 or more and 0.5 or less.

3. The nitride fluorescent material according to claim 1, wherein the integrated value Z1 is 0.1 or more and 2.0 or less.

4. A light emitting device comprising the nitride fluorescent material according to claim 1, and an excitation light source.

5. A nitride fluorescent material comprising:
a crystal of a nitride fluorescent material; and
a film containing a fluorine-containing compound on the surface of the crystal, and
a carbonate and a hydroxide in the vicinity of a surface of the crystal of the nitride fluorescent material:
wherein the crystal of the nitride fluorescent material contains a composition represented by the following formula (I) and has a content of elemental fluorine in a range of 1% by mass or more and 7% by mass or less:

$$M^a{}_v M^b{}_w M^c{}_x Al_{3-y} Si_y N_z \qquad (I)$$

wherein
$M^a$ is at least one element selected from the group consisting of Ca, Sr, Ba and Mg,
$M^b$ is at least one element selected from the group consisting of Li, Na and K,
$M^c$ is at least one element selected from the group consisting of Eu, Ce, Tb and Mn, and
v, w, x, y and z each are numbers satisfying $0.80 \leq v \leq 1.05$, $0.80 \leq w \leq 1.05$, $0.001 < x \leq 0.1$, $0 \leq y \leq 0.5$ and $3.0 \leq z \leq 5.0$,
wherein when the maximum value of absorbance in a wavenumber domain of 450 cm$^{-1}$ or more and less than 900 cm$^{-1}$ is taken as 1 in an infrared absorption spectrum of the nitride fluorescent material measured by a Fourier transform infrared spectrometer, an integrated value Z1 of a domain surrounded by a base line A that is a straight line connecting absorbance values at both ends of a wavenumber domain of from 1,200 cm$^{-1}$ to 1,600 cm$^{-1}$ and an absorbance spectrum in a wavenumber domain of 1,200 cm$^{-1}$ or more and less than 1,600 cm$^{-1}$ is 0.1 or more and 4.0 or less, or an integrated value Z2 of a domain surrounded by a base line B that is a straight line connecting absorbance values at both ends of a wavenumber domain of from 2,700 cm$^{-1}$ to 3,680 cm$^{-1}$ and an absorbance spectrum in a wavenumber domain of 2,700 cm$^{-1}$ or more and less than 3,680 cm$^{-1}$ is 0.05 or more and 0.5 or less, or the integrated value Z1 is 0.1 or more and 4.0 or less and the integrated value Z2 is 0.05 or more and 0.5 or less, the integrated value Z1 is originated from a carbonate group in the carbon and the integrated value Z2 is originated from a hydroxyl group in the hydroxide.

6. The nitride fluorescent material according to claim 5, wherein the crystal of the nitride fluorescent material has a first film comprising a first fluorine-containing compound and a second film comprising a second fluorine-containing compound having a composition different from that of the first film, on the surface thereof.

7. The nitride fluorescent material according to claim 6, wherein the first film comprises at least one element selected from the group consisting of Ca, Sr, Ba and Mg; and fluorine, and wherein the second film comprises at least one element selected from the group consisting of Ca, Sr, Ba and Mg; Al; N; and fluorine.

8. The nitride fluorescent material according to claim 6, having the first film on the surface of the crystal of the nitride fluorescent material and having the second film on a lower layer of the first film.

* * * * *